(12) United States Patent
Ieda

(10) Patent No.: US 8,319,269 B2
(45) Date of Patent: Nov. 27, 2012

(54) SEMICONDUCTOR DEVICE HAVING A MEMORY ELEMENT

(75) Inventor: Yoshinori Ieda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 441 days.

(21) Appl. No.: 12/143,472

(22) Filed: Jun. 20, 2008

(65) Prior Publication Data

US 2008/0315286 A1 Dec. 25, 2008

(30) Foreign Application Priority Data

Jun. 25, 2007 (JP) ................. 2007-166495

(51) Int. Cl.
*H01L 29/788* (2006.01)
(52) U.S. Cl. ........ 257/316; 257/314; 257/347; 438/157; 438/211
(58) Field of Classification Search .......... 257/316, 257/315, 314, 347; 438/157, 211, 164
See application file for complete search history.

(56) References Cited

U.S. PATENT DOCUMENTS

| | | | |
|---|---|---|---|
| 3,996,657 A | 12/1976 | Simko et al. | |
| 6,586,349 B1 | 7/2003 | Jeon et al. | |
| 6,646,288 B2 * | 11/2003 | Yamazaki et al. | 257/72 |
| 6,674,109 B1 | 1/2004 | Fujimori et al. | |
| 7,268,031 B2 | 9/2007 | Forbes | |
| 7,335,556 B2 | 2/2008 | Yamaguchi et al. | |
| 7,791,172 B2 | 9/2010 | Akimoto | |
| 7,842,992 B2 | 11/2010 | Yamazaki et al. | |
| 7,989,871 B2 * | 8/2011 | Yasuda | 257/316 |
| 2002/0079533 A1 | 6/2002 | Horiguchi et al. | |
| 2003/0151948 A1 * | 8/2003 | Bhattacharyya | 365/185.18 |
| 2005/0263767 A1 | 12/2005 | Yamazaki et al. | |
| 2006/0118858 A1 | 6/2006 | Jeon et al. | |
| 2006/0267077 A1 * | 11/2006 | Kato | 257/316 |
| 2007/0004049 A1 | 1/2007 | Nasu et al. | |
| 2007/0063147 A1 | 3/2007 | Yamazaki et al. | |

(Continued)

FOREIGN PATENT DOCUMENTS

JP 07-058225 3/1995

(Continued)

OTHER PUBLICATIONS

International Search Report Application No. PCT/JP2008/061167; PCT10726 Dated Sep. 30, 2008.

(Continued)

*Primary Examiner* — Phuc Dang
(74) *Attorney, Agent, or Firm* — Nixon Peabody LLP; Jeffrey L. Costellia

(57) ABSTRACT

A decease in reliability of a memory element having a floating gate is suppressed. The invention relates to a semiconductor device having an island-like semiconductor film, which is formed over an insulating surface and includes a channel formation region and a high-concentration impurity region, a tunneling insulating film formed over the island-like semiconductor film, a floating gate formed over the tunneling insulating film, a gate insulating film formed over the floating gate, a control gate formed over the gate insulating film, and a first insulating film formed between the tunneling insulating film and the floating gate. The first insulating film is formed of an oxide film of the material of the floating gate, so that the material of the floating gate is prevented from diffusing into the tunneling insulating film.

29 Claims, 16 Drawing Sheets

U.S. PATENT DOCUMENTS

| | | | |
|---|---|---|---|
| 2007/0132004 A1 | 6/2007 | Yasuda et al. | |
| 2007/0221971 A1 | 9/2007 | Yamazaki et al. | |
| 2007/0228453 A1* | 10/2007 | Yamazaki et al. | 257/316 |
| 2007/0235793 A1 | 10/2007 | Yamazaki et al. | |
| 2007/0235794 A1 | 10/2007 | Yamazaki et al. | |
| 2008/0144374 A1 | 6/2008 | Kato | |
| 2008/0203454 A1 | 8/2008 | Asami | |
| 2008/0290393 A1* | 11/2008 | Kakehata et al. | 257/316 |
| 2008/0315286 A1* | 12/2008 | Ieda | 257/316 |
| 2009/0189215 A1* | 7/2009 | Samanta et al. | 257/325 |

FOREIGN PATENT DOCUMENTS

| | | |
|---|---|---|
| JP | 10-233505 | 9/1998 |
| JP | 2005-259334 | 9/2005 |
| JP | 2006-013481 | 1/2006 |
| WO | WO-01/24265 A1 | 4/2001 |
| WO | WO-2005/076281 A1 | 8/2005 |

OTHER PUBLICATIONS

Written Opinion Application No. PCT/JP2008/061167; PCT10726 Dated Sep. 30, 2008.

Chinese Office Action (Application No. 200880021052.X; CN10726), dated Sep. 10, 2010, with English translation.

Chinese Office Action (Application No. 200880021052.X;PCTCN10726) Dated Nov. 17, 2011,.

* cited by examiner

200

200

200

200

200

200

SEMICONDUCTOR DEVICE HAVING A MEMORY ELEMENT

TECHNICAL FIELD

The present invention relates to a semiconductor device having memory elements and a method of fabricating the semiconductor device.

Note that a semiconductor device in the invention refers to a device having a circuit including semiconductor elements (such as transistors and diodes).

BACKGROUND ART

In today's society where many electronic devices are used, various kinds of data are being produced and used. In order to store such data, it is necessary to use a memory element (hereinafter also referred to as "memory"). Various kinds of memory that are produced and used now have both advantages and disadvantages and are selectively used according to the kind of data to be used and stored therein.

Memory can be broadly divided into two kinds, i.e., volatile memory and nonvolatile memory. Volatile memory is memory whose memory content is lost once power is turned off. Nonvolatile memory is memory that can retain its memory content even when power is turned off. Examples of volatile memory include DRAM (dynamic random access memory) and SRAM (static random access memory). The use of volatile memory is very limited as the memory content is lost once power is turned off; however, the volatile memory is used for cache memory of computers or the like because of its advantage of a short access time. DRAM has small memory cells and can have a high capacity; however, a method of controlling the DRAM is complex, resulting in high power consumption. Meanwhile, methods of fabricating and controlling SRAM are easy since it has memory cells constructed from CMOS; however, the SRAM has a difficulty in having a high capacity since each memory cell requires six transistors.

Nonvolatile memory, which is memory capable of retaining its memory content even when power is turned off, can be broadly divided into three kinds, i.e., rewritable memory, write-once memory, and mask ROM (read only memory). Rewritable memory can be rewritten with data up to a limited number of times. Write-once memory can be written with data by a user only once. The data content of mask ROM is determined during its fabrication, and the data content cannot be rewritten.

Examples of rewritable nonvolatile memory include EPROM, flash memory, and ferroelectric memory. EPROM can be written with data easily, and has a relatively low unit cost per bit. However, EPROM requires dedicated programming and erasing devices for writing and erasing data. Meanwhile, flash memory and ferroelectric memory can be rewritten with data on a substrate being used, and have a short access time and low power consumption.

As an example of a structure of flash memory, there is known a structure in which a tunneling insulating film, a floating gate, a gate insulating film, and a control gate are formed over an active layer (see Reference 1: Japanese Published Patent Application No. 2006-13481). In such nonvolatile memory of a floating-gate type, electrical charge is injected to the floating gate through the tunneling insulating film over the channel formation region which is formed in the active layer, so that the electrical charge is retained in the memory.

DISCLOSURE OF INVENTION

When a floating gate is formed with a metal film, for example, a titanium film, there is a possibility that titanium atoms diffuse into a tunneling insulating film depending on the temperature of heat treatment applied during a fabrication process. The diffusion of the titanium atoms into the tunneling insulating film will result in a reduction in thickness of the tunneling insulating film. Thus, a problem arises in that the thickness of the tunneling insulating film cannot be controlled.

Accordingly, there is a concern that the reliability of the memory element itself might be decreased. Thus, it is an object of the invention to solve the aforementioned problems.

In the invention, an oxide film containing the material of a floating gate is formed between the floating gate and a tunneling insulating film. Accordingly, even when an element included in the floating gate is diffused by heat, it will not diffuse into the tunneling insulating film because of the presence of the oxide film. Since the oxide film originally contains the element included in the floating gate, there arises no problem when the element included in the floating gate diffuses into the oxide film.

Further, when another oxide film containing the material of the floating gate is also formed between the floating gate and a gate insulating film, the element included in the floating gate will not diffuse into the gate insulating film. Thus, a memory element with higher reliability can be provided.

The invention relates to the following nonvolatile semiconductor memory device and memory element, and a method of fabricating them.

The invention relates to a semiconductor device having an island-like semiconductor film, which is formed over an insulating surface and includes a channel formation region and a high-concentration impurity region, a tunneling insulating film formed over the island-like semiconductor film, a floating gate formed over the tunneling insulating film, a gate insulating film formed over the floating gate, a control gate formed over the gate insulating film, and a first insulating film formed between the tunneling insulating film and the floating gate. The first insulating film is formed of an oxide film of a material of the floating gate, so that the material of the floating gate is prevented from diffusing into the tunneling insulating film.

In one aspect of the invention, a second insulating film is formed between the floating gate and the gate insulating film, and the second insulating film is formed of an oxide film of the material of the floating gate, so that the material of the floating gate is prevented from diffusing into the gate insulating film.

In one aspect of the invention, the floating gate is formed of titanium, and the first insulating film is formed of titanium oxide.

In one aspect of the invention, the floating gate is formed of titanium, and the second insulating film is formed of titanium oxide.

In one aspect of the invention, the island-like semiconductor film is formed of a single-crystalline semiconductor layer.

According to the invention, even when an element included in the floating gate is diffused, it will not affect the tunneling insulating film or the gate insulating film. Thus, the thicknesses of the tunneling insulating film and the gate insulating film can be controlled. Accordingly, a memory element with high reliability can be provided.

BEST MODE FOR CARRYING OUT THE INVENTION

Hereinafter, embodiment modes of the invention will be described with reference to the accompanying drawings. Note that it will be easily understood by those skilled in the art that the invention can be embodied in various different ways and that various modifications and variations can be made to the invention without departing from the spirit and scope thereof. Thus, the invention should not be construed as being limited to the description in the following embodiment modes.

Embodiment Mode 1

This embodiment mode will be described with reference to FIGS. 1, 2A to 2C, 3A to 3D, 4A to 4C, and 5.

Figure 1:
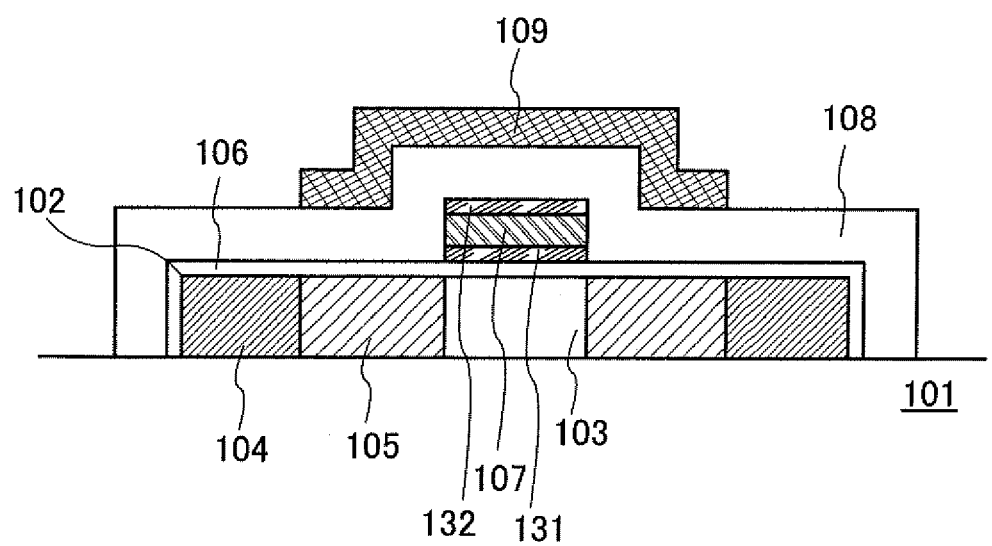
FIG. 1 is a cross-sectional view of a memory element of the invention.

FIG. 1 illustrates a cross-sectional structure of a memory element of this embodiment mode. An island-like semiconductor film 102 which is an active layer is formed over an insulating surface 101. Formed in the island-like semiconductor film 102 are a channel formation region 103, low-concentration impurity regions 105, and high-concentration impurity regions 104 that are source and drain regions.

A tunneling insulating film 106, an insulating film 131, a floating gate 107, an insulating film 132, a gate insulating film 108, and a control gate 109 are formed over the island-like semiconductor film 102.

The insulating surface 101 can be a substrate or a substrate with an insulating film formed over its surface. Examples of the substrate include a glass substrate, a plastic substrate, and an SOI (silicon on insulator) substrate. In the case of forming an insulating film over the substrate, the insulating film can be a silicon oxide film, a silicon nitride film, a silicon nitride film containing oxygen, or a silicon oxide film containing nitrogen.

Silicon (Si) may be used for the island-like semiconductor film 102 which is the active layer. The thickness of the island-like semiconductor film 102 may be 60 nm, for example. In addition, silicon oxide may be used for the tunneling insulating film 106, and it is formed to a thickness of 8 to 10 nm.

In the invention, the insulating films 131 and 132 are each formed with an oxide film that includes the same material as the floating gate 107. Accordingly, even when a metal element of the floating gate 107 is diffused by heat, there is no problem because the insulating films 131 and 132 contain the same material as the floating gate 107 and, thus, the metal element will not diffuse into the tunneling insulating film 106 or the gate insulating film 108. Accordingly, the reliability of the memory element can be increased.

The floating gate 107 is preferably formed with titanium (Ti). Besides, tantalum (Ta), tungsten (W), or the like can also be used. Therefore, the insulating films 131 and 132 are preferably formed with titanium oxide. Alternatively, when the floating gate 107 is formed with tantalum (Ta) or tungsten (W), the insulating films 131 and 132 can be formed with tantalum oxide, tungsten oxide, or the like.

Note that the insulating film 132 does not need to be formed if the gate insulating film 108 that will be formed in a later step is sufficiently thick such that the gate insulating film 108 remains with its insulating function intact even when the metal element of the floating gate 107 has diffused into the gate insulating film 108.

The gate insulating film 108 and the control gate 109 are formed over the insulating film 132. When the insulating film 132 is not formed, the gate insulating film 108 and the control gate 109 are formed over the floating gate 107.

The gate insulating film 108 may be formed with a silicon oxide film, a silicon nitride film, a silicon nitride film containing oxygen, a silicon oxide film containing nitrogen, or the like. In addition, the control gate 109 may be formed with tungsten (W), tantalum (Ta), titanium (Ti), aluminum (Al), or the like.

Described next is a specific method of fabricating a memory element of this embodiment mode.

Figure 2A:
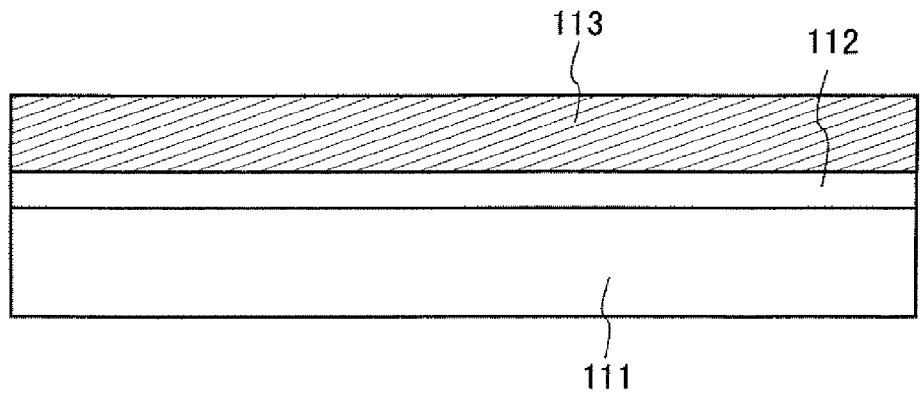
FIGS. 2A to 2C are cross-sectional views illustrating the steps of fabricating a memory element of the invention.
Figure 2B:
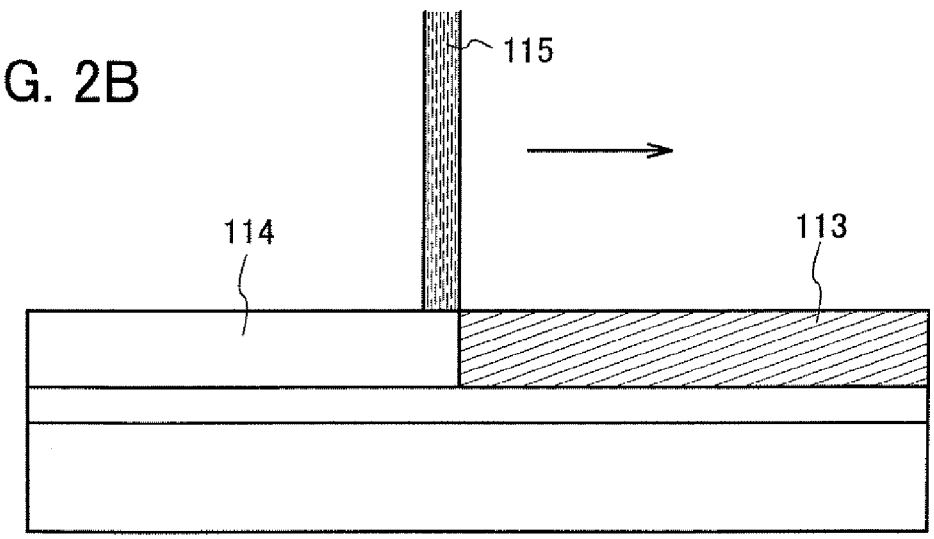

A base film 112 and an amorphous semiconductor film 113 are sequentially formed over a substrate 111 (see FIG. 2A). The substrate 111 can be a glass substrate, a quartz substrate, or the like, for example. The base film 112 can be a silicon oxide film, a silicon nitride film, a silicon nitride film containing oxygen, a silicon oxide film containing nitrogen, or a stacked film of such films. For example, a silicon oxide film with a thickness of 100 nm may be used. The amorphous semiconductor film 113 is formed to a thickness of 20 to 150 nm. In this embodiment mode, an amorphous silicon film with a thickness of 60 nm is formed.

Next, the amorphous semiconductor film 113 is crystallized to form a crystalline semiconductor film 114. Crystallization may be carried out by introducing an element which promotes crystallization to the amorphous semiconductor film and applying heat treatment thereto or by irradiation with a laser beam. In this embodiment mode, the amorphous silicon film is crystallized by irradiation with a laser beam 115, so that a crystalline silicon film is formed (see FIG. 2B1).

Figure 2C:
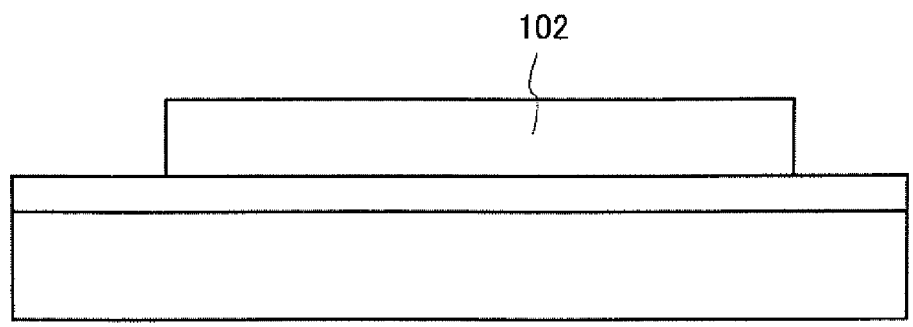

Next, the island-like semiconductor film 102 is formed using the crystalline semiconductor film 114 obtained (see FIG. 2C).

Figure 3A:
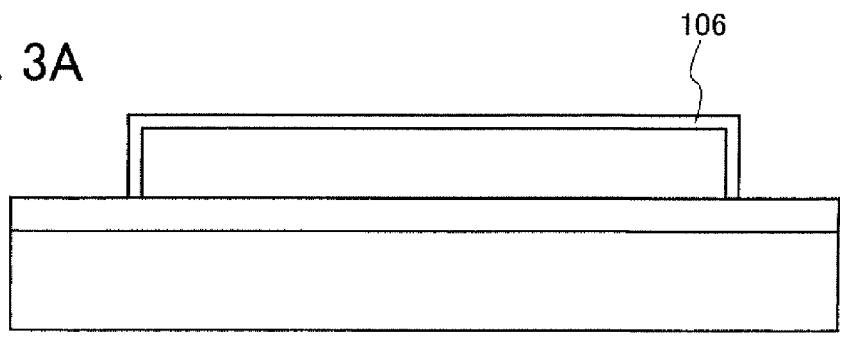
FIGS. 3A to 3D are cross-sectional views illustrating the steps of fabricating a memory element of the invention.

After the formation of the island-like semiconductor film 102, the tunneling insulating film (also referred to as a tunneling oxide film) 106 is formed to a thickness of 8 to 10 nm (see FIG. 3A). Here, the tunneling insulating film 106 is formed to a thickness of 10 nm.

Next, an oxide film (a first oxide film), which includes the same material as the floating gate 107, is deposited. The floating gate 107 is preferably formed with titanium (Ti), but may also be formed with tantalum (Ta) or tungsten (W). Therefore, the first oxide film may be formed with titanium oxide, tantalum oxide, tungsten oxide, or the like. In this embodiment mode, a titanium oxide film deposited to a thickness of 5 nm by sputtering is used as the first oxide film.

Next, a conductive film for forming the floating gate 107, which is a titanium film here, is deposited over the first oxide film to a thickness of 20 nm by sputtering. It is also possible to use a tantalum (Ta) film, a tungsten (W) film, or the like for the conductive film for forming the floating gate 107 as described above.

Next, a second oxide film is deposited to a thickness of, for example, 5 nm using the same material as the first oxide film, over the conductive film for forming the floating gate 107.

Figure 3B:
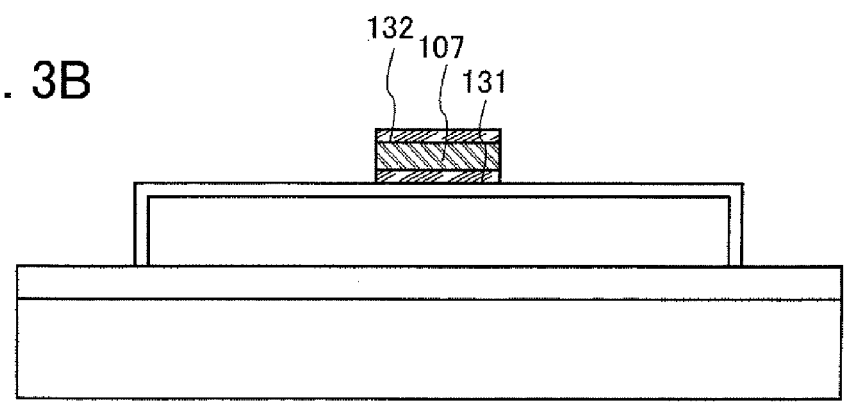
Figure 3C:
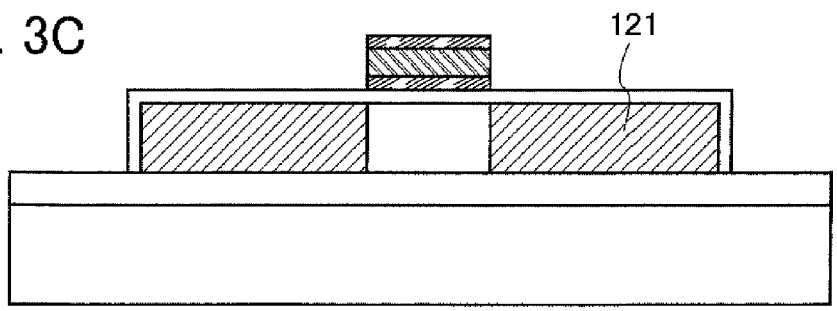

Next, the first oxide film, the conductive film, and the second oxide film are etched to form the insulating film 131, the floating gate 107, and the insulating film 132 (see FIG. 3B).

Figure 5:
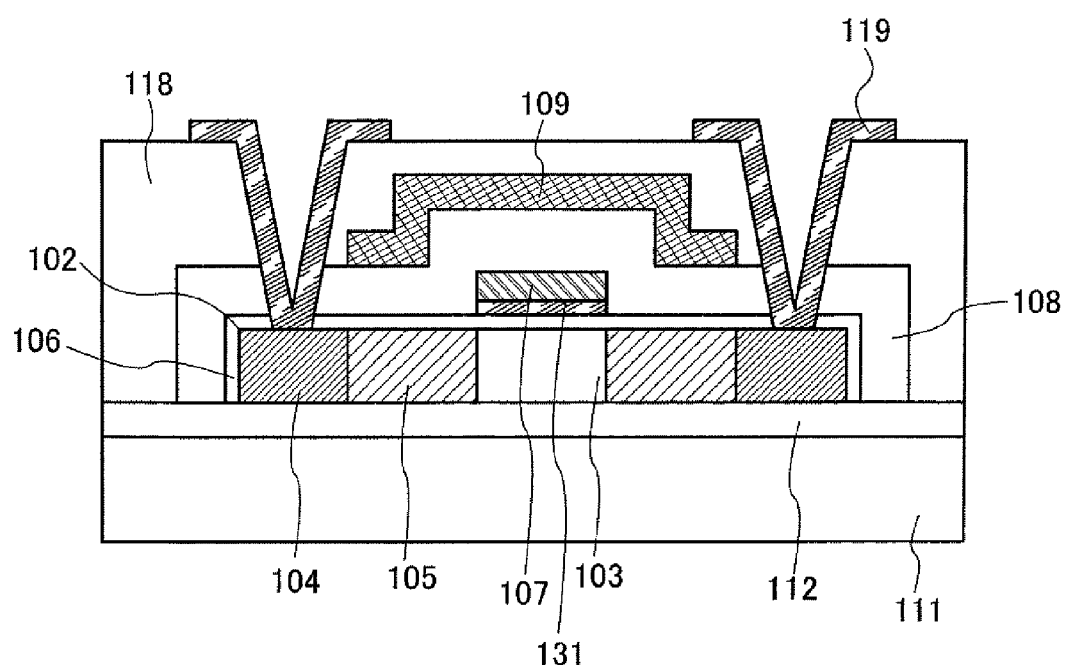
FIG. 5 is a cross-sectional view of a memory element of the invention.

Note that the insulating film 132 does not need to be formed if the gate insulating film 108 that will be formed in a later step is sufficiently thick such that the gate insulating film 108 remains with its insulating function intact even when the metal element of the floating gate 107 has diffused into the gate insulating film 108 (see FIG. 5).

After the formation of the insulating film 131, the floating gate 107, and the insulating film 132, the island-like semiconductor film 102 is doped with an impurity which imparts one conductivity type with the insulating film 131, the floating gate 107, and the insulating film 132 used as masks. In this embodiment mode, phosphorus (P) is used as the impurity which imparts one conductivity type and is added at a dosage of $1.0\times10^{14}$ atoms/cm$^2$ and an accelerating voltage of 40 keV. Accordingly, low-concentration impurity regions 121 containing phosphorus at a concentration of $1\times10^{12}$ atoms/cm$^3$ are formed in regions of the island-like semiconductor film 102, which do no overlap with the insulating film 131, the floating gate 107, or the insulating film 132 (see FIG. 3C).

Figure 3D:
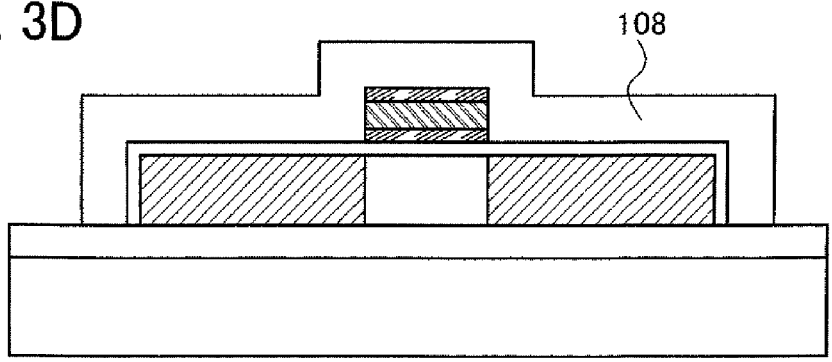

Next, the gate insulating film 108 is formed to a thickness of 20 to 50 nm over the insulating film 132 and the tunneling insulating film 106 or over the floating gate 107 and the tunneling insulating film 106 if the insulating film 132 is not formed (see FIG. 3D).

Figure 4A:
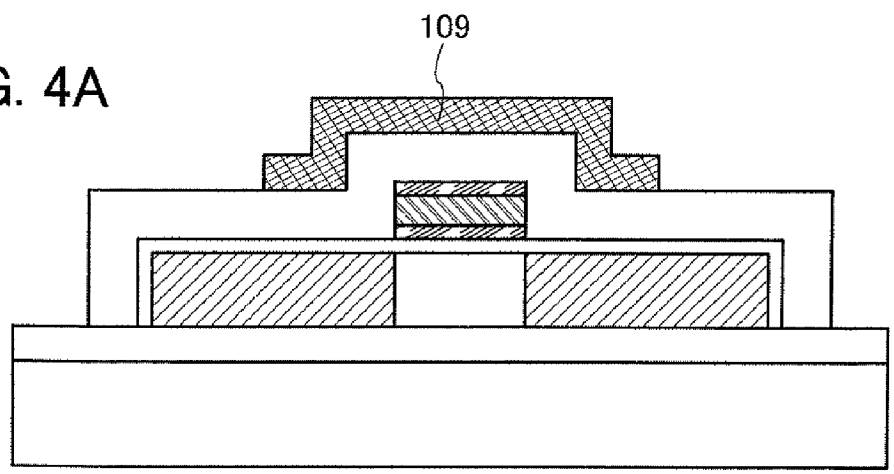
FIGS. 4A to 4C are cross-sectional views illustrating the steps of fabricating a memory element of the invention.

Further, the control gate 109 is formed over the gate insulating film 108, using a conductive film made of Ta, W, or the like (see FIG. 4A). The control gate 109 is positioned to partially overlap with the low-concentration impurity regions 121 so that the control gate 109 is used as a mask for forming the low-concentration impurity regions 105 in a later step.

Figure 4B:
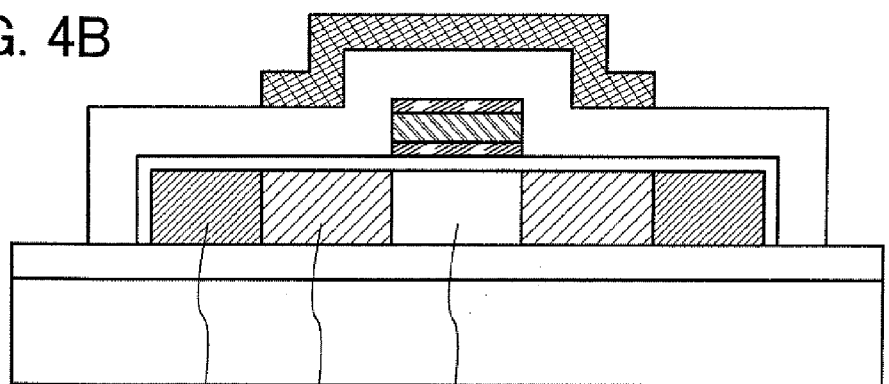
Figure 4C:
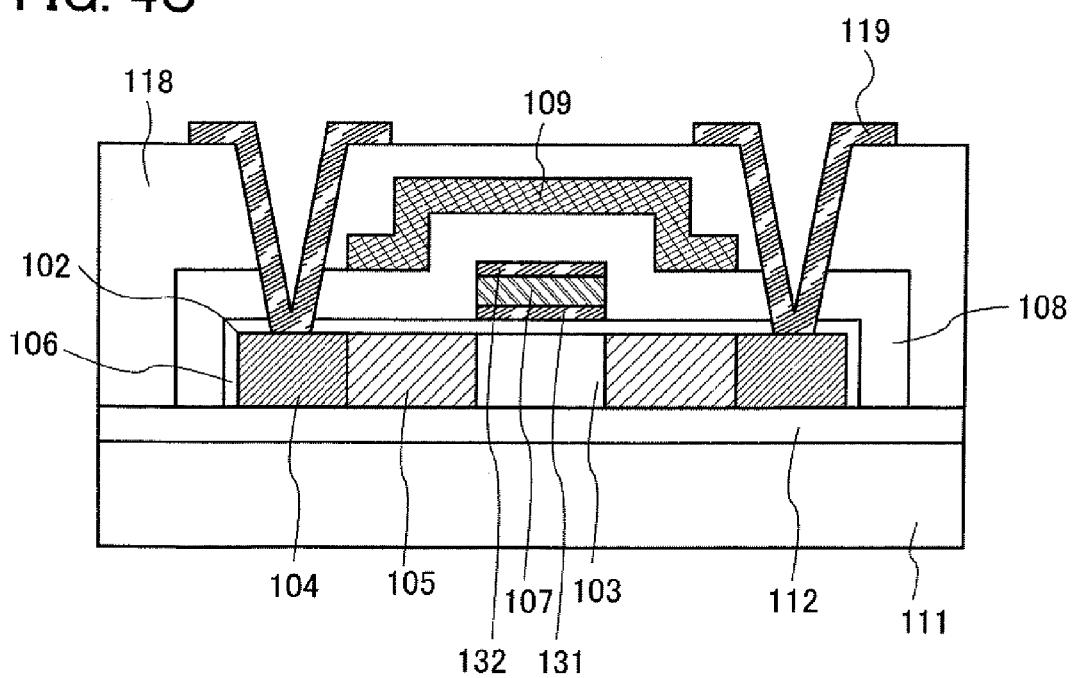

Next, the island-like semiconductor film 102 is doped with an impurity element which imparts one conductivity type with the control gate 109 used as a mask, so that the high-concentration impurity regions 104 that are the source and drain regions, the low-concentration impurity regions 105, and the channel formation region 103 are formed (see FIG. 4B). In this embodiment mode, phosphorus (P) is added at a dosage of $3.0\times10^{15}$ atoms/cm$^2$ and an accelerating voltage of 25 keV by doping. Note that since the impurity element which imparts one conductivity type is added with the control gate 109 used as a mask, the boundaries between the high-concentration impurity regions 104 and the low-concentration impurity regions 105 correspond to the edges of the control gate 109.

Next, an interlayer insulating film 118 is formed to cover the island-like semiconductor film 102 and the control gate 109. Further, contact holes, which reach the high-concentration impurity regions 104 that are the source and drain regions, are formed in the interlayer insulating film 118.

Further, conductive films are formed over the interlayer insulating film 118. With the conductive films, wirings 119, which are electrically connected to the high-concentration impurity regions 104 serving as the source and drain regions through the contact holes of the interlayer insulating film 118, are formed. Thus, a memory element is formed (see FIG. 4C).

According to this embodiment mode, even when the element included in the floating gate 107 is diffused by heat, it does not diffuse into the tunneling insulating film 106 because the insulating film 131 is formed. Further, since the insulating film 132 is formed, the element does not diffuse into the gate insulating film 108 either. Accordingly, a memory element with high reliability can be provided.

Embodiment Mode 2

Figure 6:
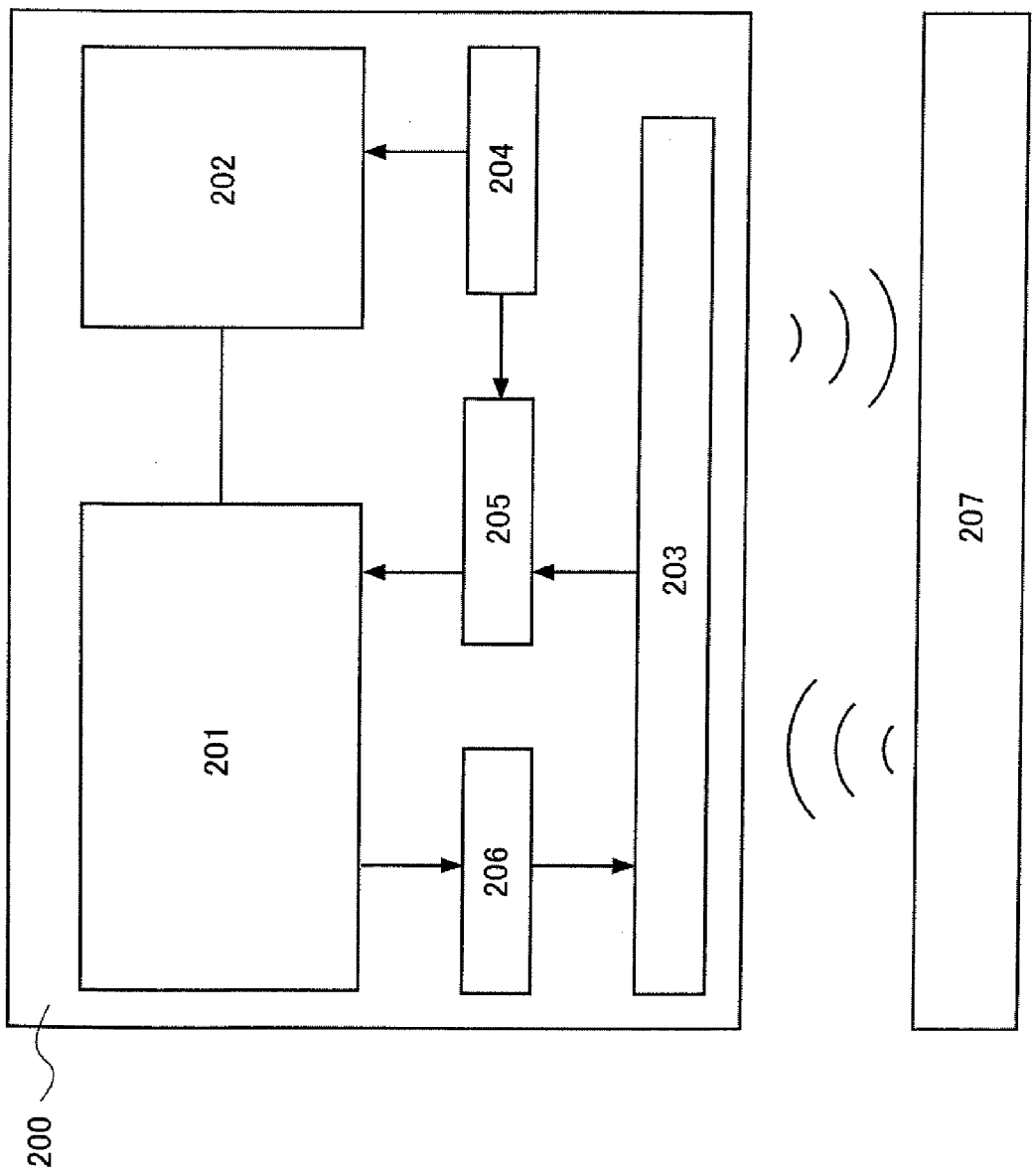
FIG. 6 is a block diagram of a semiconductor device capable of radio communication, which uses a memory element of the invention.
Figure 7A:
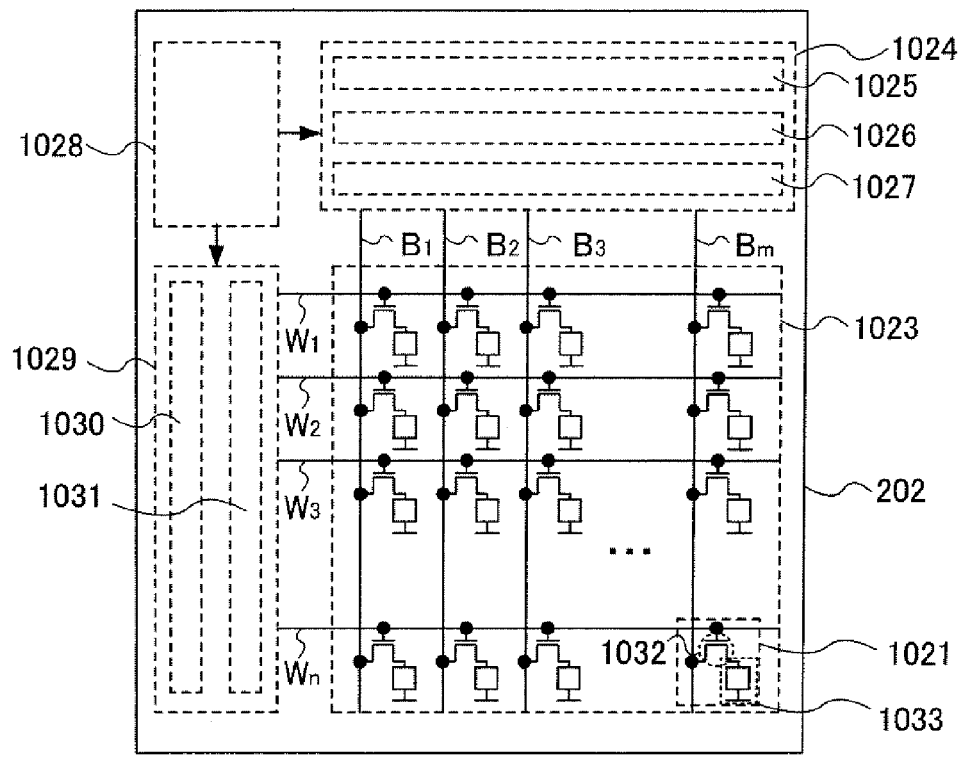
FIGS. 7A and 7B are circuit diagrams of a semiconductor device capable of radio communication, which uses a memory element of the invention.
Figure 7B:
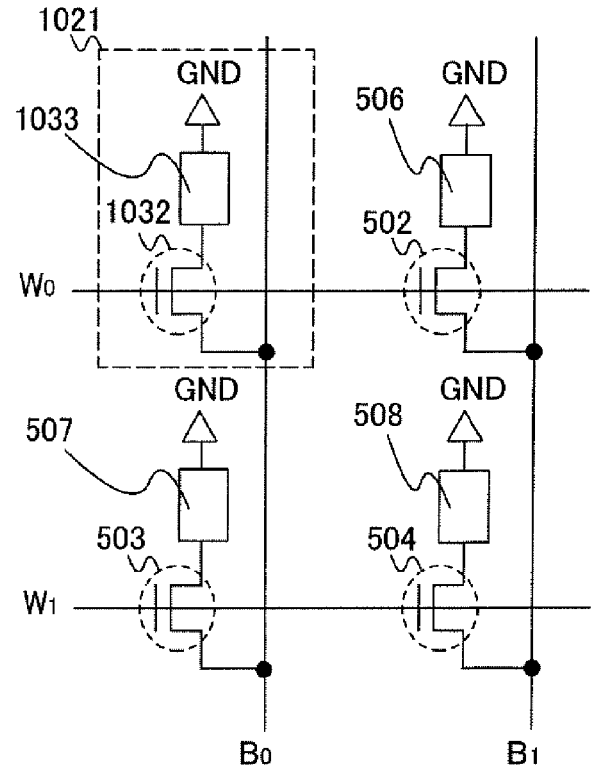

This embodiment mode will describe a case where a memory element of the invention is used for a semiconductor device capable of radio communication, with reference to FIGS. 6, 7A, and 7B.

As illustrated in FIG. 6, a semiconductor device 200 capable of radio communication of this embodiment mode includes an arithmetic processing circuit 201, a memory circuit 202, an antenna 203, a power supply circuit 204, a demodulation circuit 205, and a modulation circuit 206. The antenna 203 and the power supply circuit 204 are the essential components of the semiconductor device 200 capable of radio communication, and other components are provided as appropriate according to the use of the semiconductor device 200 capable of radio communication.

The arithmetic processing circuit 201, based on a signal input from the demodulation circuit 205, analyzes instructions, controls the memory circuit 202, or outputs data, which is to be transmitted to the outside, to the modulation circuit 206, for example.

The memory circuit 202 includes a circuit having memory elements and a control circuit for writing and reading data. The memory circuit 202 stores at least a unique identification number of the semiconductor device. The unique identification number is used for distinguishing the semiconductor device 200 from other semiconductor devices. In addition, the memory circuit 202 may be formed using the memory element described in Embodiment Mode 1.

The antenna 203 converts a carrier wave, which is supplied from a reader/writer 207, to an AC electrical signal. The modulation circuit 206 applies load modulation. The power supply circuit 204 generates a power supply voltage using the AC electrical signal obtained by conversion of the carrier wave with the antenna 203, and supplies the power supply voltage to each circuit.

The demodulation circuit 205 demodulates the AC electrical signal, which has been obtained by conversion of the carrier wave with the antenna 203, and supplies the demodulated signal to the arithmetic processing circuit 201. The modulation circuit 206, based on a signal supplied from the arithmetic processing circuit 201, applies load modulation to the antenna 203.

The reader/writer 207 receives the load modulation applied to the antenna 203 as a carrier wave. In addition, the reader/writer 207 transmits a carrier wave to the semiconductor device 200 capable of radio communication. Note that a carrier wave is an electromagnetic wave transmitted to or received by the reader/writer 207, and the reader/writer 207 receives a carrier wave modulated by the modulation circuit 206.

FIG. 7A illustrates a structure in which memory elements in accordance with the invention are mounted on and arranged in matrix in the memory circuit 202. Although FIG. 7A illustrates a structure in which all of the memory elements employ the memory elements of the invention, the memory elements are not limited thereto. For example, the memory circuit 202 may be mounted with a memory portion that uses the memory elements of the invention and stores a unique identification number of the semiconductor device and with another/other memory portion/portions.

FIG. 7A is a configuration example of the memory circuit 202 in which the memory elements of the invention are arranged in matrix. The memory circuit 202 includes a memory cell array 1023 in which memory cells 1021 are arranged in matrix; a bit line driver circuit 1024 having a column decoder 1025, a reading circuit 1026, and a selector 1027; a word line driver circuit 1029 having a row decoder 1030 and a level shifter 1031; and an interface 1028 which has a writing circuit and the like and communicates with the outside. Note that the configuration of the memory circuit 202 illustrated herein is only exemplary and, thus, the memory circuit 202 may have other circuits such as a sense amplifier, an output circuit, and/or a buffer. It is also possible to provide the writing circuit in the bit line driver circuit.

Each memory cell 1021 includes a first wiring which corresponds to a word line $W_y$ ($1 \leq y \leq n$), a second wiring which corresponds to a bit line $B_x$ ($1 \leq x \leq m$), a TFT 1032, and a memory element 1033.

Next, the operations of writing and reading data to/from the memory cells of the invention will be described with reference to FIG. 7B. Note that here, a state in which "0" is written to a memory cell is referred to as a "second state" whereas a state in which "1" is written to the memory cell is referred to as a "first state."

First, an exemplary circuit operation for writing "0" to the memory cell 1021 will be described. Writing operation is performed by selecting the word line $W_0$ of the memory cell 1021 and flowing a current through the bit line $B_0$. That is, it is acceptable as long as a memory cell to be written with data is selected by the word line $W_0$ and a voltage high enough to insulate the memory element 1033 is applied so that the memory element 1033 shifts from the first state to the second state. This voltage is assumed to be 10 V, for example. At this time, TFTs 502, 503, and 504 are turned off in order to prevent data from being written to memory elements 506, 507, and 508 of other memory cells. For example, the word line $W_1$ and the bit line $B_1$ may be set at 0 V. By applying a voltage, which is high enough to shift the memory element 1033 from the first state to the second state, to the bit line $B_0$ while selecting only the word line $W_0$, it is possible to obtain a state in which "0" is written to the memory element 1033.

Next, an exemplary operation of reading data from the memory cell 1021 will be described. The reading operation can be conducted by judging whether the memory element 1033 of the memory cell 1021 is in the first state, in which "1" is written, or in the second state, in which "0" is written. For example, a case will be described in which whether "0" or "1" is written to the memory cell 1021 is read out. The memory element 1033 is in the state in which "0" is written. That is, the memory element 1033 is insulated. The word line $W_0$ is selected to turn on the TFT 1032. Here, a voltage higher than a predetermined voltage is applied to the bit line $B_0$ with the TFT 1032 being in the on-state. Here, the predetermined voltage is assumed to be 5 V. At this time, if the memory element 1033 is in the first state, that is, if the memory element 1033 is not insulated, a current flows through a grounded wiring within the memory cell 1021, so that the voltage of the bit line $B_0$ becomes 0 V. To the contrary, if the memory element 1033 is in the second state, that is, if the memory element 1033 is insulated, the voltage of the bit line $B_0$ is unchanged at 5 V without a current flowing through the grounded wiring within the memory cell 1021. In this way, whether "0" or "1" is written to the memory element 1033 can be judged by reading the voltage of the bit line.

As described above, the memory element of the invention can be applied to a semiconductor device capable of radio communication.

Embodiment Mode 3

Figure 8A:
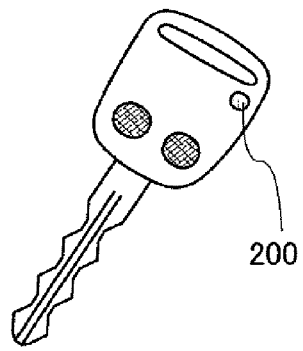
FIGS. 8A to 8F are views illustrating examples of the application of a semiconductor device of the invention.
Figure 8B:
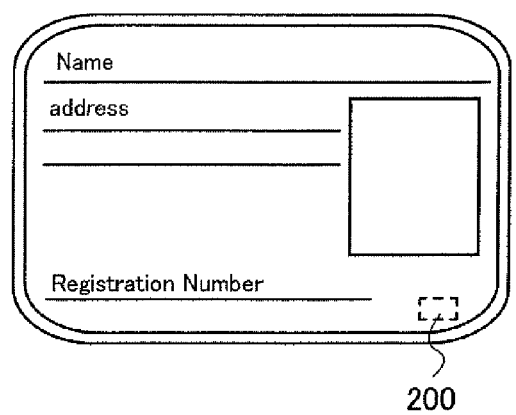
Figure 8C:
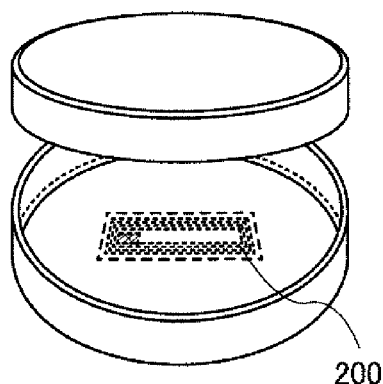
Figure 8D:
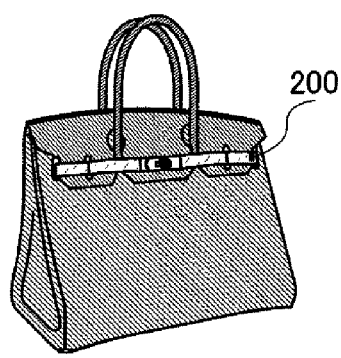
Figure 8E:
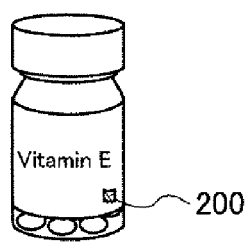
Figure 8F:
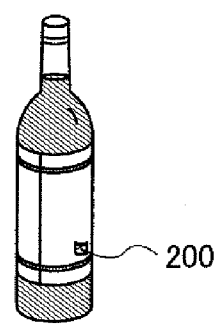

The semiconductor device 200, which is capable of radio communication, fabricated based on Embodiment Mode 2 can be used for a variety of items and systems by utilizing its function of transmitting and receiving electromagnetic waves. Examples of items to which the semiconductor device 200 which is capable of radio communication can be applied are keys (see FIG. 8A), paper money, coins, securities, bearer bonds, documents (e.g., driver's licenses or resident's cards; see FIG. 8B), books, containers (e.g., petri dishes; see FIG. 8C), packaging containers (e.g., wrapping paper or bottles; see FIGS. 8E and 8F), recording media (e.g., disks or video tapes), means of transportation (e.g., bicycles), personal accessories (e.g., bags or eyeglasses; see FIG. 8D), food, clothing, everyday articles, electronic devices (e.g., liquid crystal display devices, EL display devices, television devices, and portable terminals), or the like.

The semiconductor device 200, which is capable of radio communication, fabricated by applying the invention is fixed to items of a variety of forms, such as those above, by being attached to or embedded in a surface. Further, a system refers to a goods management system, a system having an authentication function, a distribution system, or the like. By using the semiconductor device of the invention, a system can be made more sophisticated and multifunctional and can have higher added value.

Embodiment Mode 4

This embodiment mode will describe a method of fabricating the island-like semiconductor film 102 of Embodiment Mode 1 with a substrate having an SOI structure with reference to FIGS. 9A and 9B, 10A to 10C, 11A to 11C, 12A and 12B, 13A to 13C, 14A to 14C, 15A and 15B, and 16A to 16C.

First, structures of substrates with an SOI structure are described with reference to FIGS. 9A and 9B, and 10A to 10C.

Figure 9A:
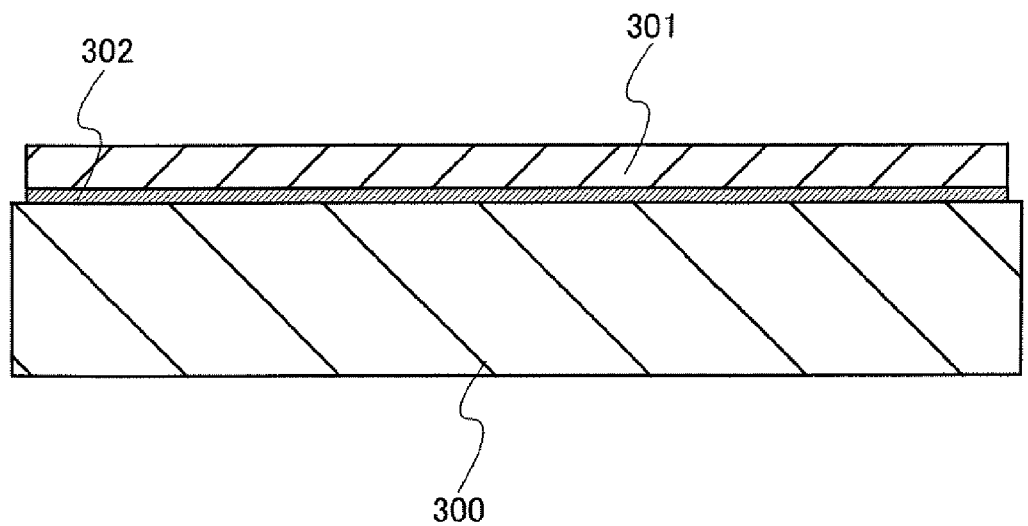
FIGS. 9A and 9B are cross-sectional views illustrating structures of a substrate with an SOI structure.

In FIG. 9A, a supporting substrate 300 refers to an insulating substrate or a substrate having an insulating surface, and glass substrates (also referred to as "non-alkali glass substrates") that are used in the electronics industry, such as aluminosilicate glass substrates, aluminoborosilicate glass substrates, and barium borosilicate glass substrates, are used.

In other words, glass substrates that have a thermal expansion coefficient of $25 \times 10^{-7}$ to $50 \times 10^{-7}/°$ C. (preferably, $30 \times 10^{-7}$ to $40 \times 10^{-7}/°$ C.) and a strain point of 580 to 680° C. (preferably, 600 to 680° C.) can be used for the supporting substrate 300. Alternatively, quartz substrates, ceramic substrates, metal substrates with their surfaces covered with an insulating film, and the like can be used.

A single-crystalline semiconductor layer is used for an LTSS (low-temperature single-crystalline semiconductor) layer 301, and single-crystalline silicon is typically used.

Alternatively, as the LTSS layer 301, a crystalline semiconductor layer of silicon, germanium, or a compound semiconductor such as gallium arsenide or indium phosphide, which can be separated from a single-crystalline semiconductor substrate or a polycrystalline semiconductor substrate by a hydrogen ion implantation separation method or the like, can be used.

Between the supporting substrate 300 and the LTSS layer 301, a bonding layer 302 which has a smooth surface and forms a hydrophilic surface is provided. This bonding layer 302 is a layer which has a smooth surface and a hydrophilic surface. As a layer which can form such a surface, an insulating layer formed by a chemical reaction is preferable. For example, an oxide semiconductor film formed by a thermal or chemical reaction is suitable. The main reason is that a film formed by a chemical reaction can ensure its surface smoothness.

The bonding layer 302 which has a smooth surface and forms a hydrophilic surface is provided at a thickness of 0.2 to 500 nm. With this thickness, it is possible to smooth surface roughness of a surface on which a film is to be formed and also to ensure smoothness of a growing surface of the film.

When the LTSS layer 301 is formed of silicon, the bonding layer 302 can be formed using silicon oxide which is formed by heat treatment in an oxidizing atmosphere, silicon oxide which grows by reaction of oxygen radicals, a chemical oxide which is formed with an oxidizing chemical solution, or the like.

When a chemical oxide is used for the bonding layer 302, the bonding layer 302 may have a thickness of 0.1 to 1 nm. Preferably, the bonding layer 302 is formed of silicon oxide that is deposited by chemical vapor deposition. In this case, a silicon oxide film fabricated by chemical vapor deposition using an organic silane gas is preferable.

Examples of organic silane gases that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (IMDS), triethoxysilane (chemical formula: $SiH(OC_2H_5)_3$), and trisdimethylaminosilane (chemical formula: $SiH(N(CH_3)_2)_3$).

The bonding layer 302 is provided on the LTSS layer 301 side and located in contact with the surface of the supporting substrate 300, whereby a bond can be formed even at room temperature. In order to form a stronger bond, the supporting substrate 300 and the LTSS layer 301 may be pressed against each other. In bonding the supporting substrate 300 and the bonding layer 302 which are of different kinds of materials, the surfaces are cleaned. When the cleaned surface of the supporting substrate 300 and that of the bonding layer 302 are located in contact with each other, a bond is formed by an attracting force between the surfaces.

It is more preferable for formation of a bond that the surface of the supporting substrate 300 be subjected to treatment for attaching a plurality of hydrophilic groups to the surface. For example, it is preferable that the surface of the supporting substrate 300 be subjected to oxygen plasma treatment or ozone treatment so that the surface becomes hydrophilic.

When the surface of the supporting substrate 300 is subjected to treatment for making the surface hydrophilic, hydroxyl groups on the surface act to form a bond by hydrogen bonding. Furthermore, when heating is performed at room temperature or higher to the bonding layer 302 and the supporting substrate 300 of which the bond is formed by locating their cleaned surfaces in contact with each other, bonding strength can be made to be higher.

As treatment for bonding of the supporting substrate 300 and the bonding layer 302 which are of different kinds of materials, surfaces which are to form a bond may be cleaned by being irradiated with an ion beam obtained from an inert gas such as argon. By irradiation with an ion beam, dangling bonds are exposed on the surface of the supporting substrate 300 or the bonding layer 302, and a very active surface is formed.

If such activated surfaces are located in contact with each other, a bond between the supporting substrate 300 and the bonding layer 302 can be formed even at low temperature. A method of forming a bond after surface activation is preferably performed in vacuum because the surface needs to have a high degree of cleanness.

The LTSS layer 301 is formed by slicing of a crystalline semiconductor substrate. For example, when a single-crystalline silicon substrate is used as a single-crystalline semiconductor substrate, the LTSS layer 301 can be formed by an ion implantation separation method in which ions of hydrogen or fluorine are implanted into the single-crystalline silicon substrate to a predetermined depth and then heat treatment is performed to separate a superficial single-crystalline silicon layer. Alternatively, a method may be employed in which single-crystalline silicon is epitaxially grown on porous silicon and then a porous silicon layer is separated by cleavage with water jetting. The thickness of the LTSS layer 301 is 5 to 500 nm, preferably, 10 to 200 mn.

Figure 9B:
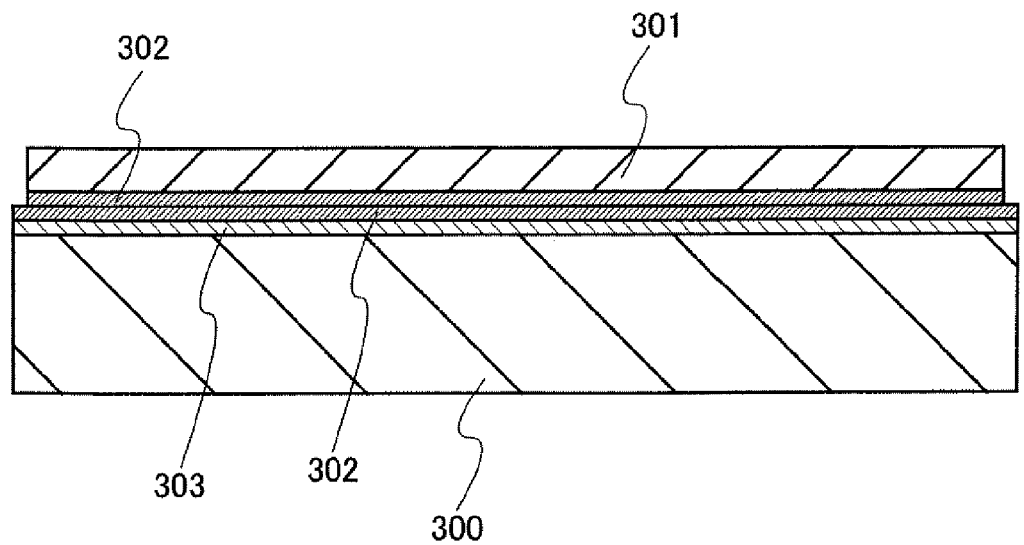

FIG. 9B shows a structure in which the supporting substrate 300 is provided with a barrier layer 303 and the bonding layer 302. By provision of the barrier layer 303, the LTSS layer 301 can be prevented from being contaminated by a mobile ion impurity like alkali metal or alkaline earth metal that is diffused from a glass substrate that is used as the supporting substrate 300. Over the barrier layer 303, the bonding layer 302 is preferably provided.

By provision of the barrier layer 303 which prevents impurity diffusion and the bonding layer 302 which ensures bonding strength, that is, a plurality of layers with different functions over the supporting substrate 300, the range of choices of the supporting substrate can be expanded. It is preferable that the bonding layer 302 be provided also on the LTSS layer 301 side. That is, in bonding the LTSS layer 301 to the supporting substrate 300, it is preferable that one or both of surfaces that are to form a bond be provided with the bonding layer 302, whereby bonding strength can be increased.

Figure 10A:
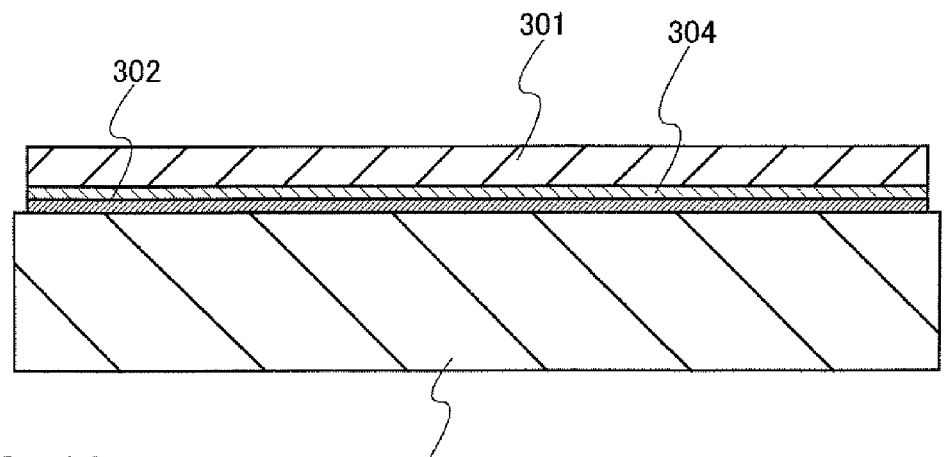
FIGS. 10A to 10C are cross-sectional views illustrating structures of a substrate with an SOI structure.

FIG. 10A shows a structure in which an insulating layer 304 is provided between the LTSS layer 301 and the bonding layer 302. It is preferable that the insulating layer 304 be a nitrogen-containing insulating layer. For example, the insulating layer 304 can be formed by using a single film or a plurality of stacked films selected from a silicon nitride film, a silicon nitride film containing oxygen, and a silicon oxide film containing nitrogen.

For example, as the insulating layer 304, a stacked-layer film can be used which is obtained by stacking a silicon oxide film containing nitrogen and a silicon nitride film containing oxygen from the LTSS layer 301 side. The bonding layer 302 functions to form a bond with the supporting substrate 300, whereas the insulating layer 304 prevents the LTSS layer 301 from being contaminated by an impurity.

Note that the silicon oxide film containing nitrogen here means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, the silicon nitride film containing oxygen means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

Figure 10B:
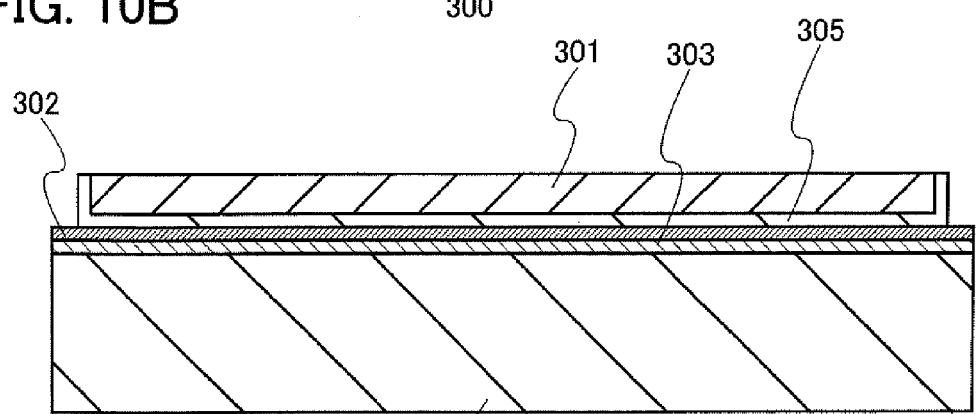

FIG. 10B shows a structure in which the supporting substrate 300 is provided with the bonding layer 302. Between the supporting substrate 300 and the bonding layer 302, the barrier layer 303 is preferably provided. This is in order to prevent the LTSS layer 301 from being contaminated by a mobile ion impurity like alkali metal or alkaline earth metal that is diffused from a glass substrate that is used as the supporting substrate 300. On the LTSS layer 301, a silicon oxide layer 305 is formed by direct oxidation. This silicon oxide layer 305 forms a bond with the bonding layer 302 and fixes the LTSS layer over the supporting substrate 300. It is preferable that the silicon oxide layer 305 be formed by thermal oxidation.

Figure 10C:
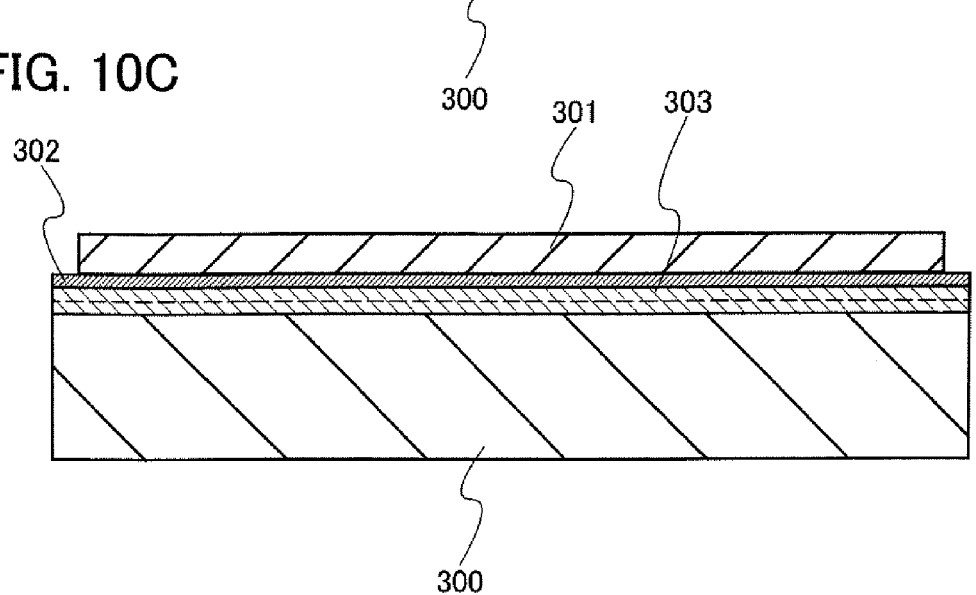

FIG. 10C shows another structure in which the supporting substrate 300 is provided with the bonding layer 302. Between the supporting substrate 300 and the bonding layer 302, the barrier layer 303 is provided.

In FIG. 10C, the barrier layer 303 is formed of a single layer or a plurality of layers. For example, a silicon nitride film or a silicon nitride film containing oxygen which is highly effective in blocking ions of sodium or the like is used as a first layer, and a silicon oxide film or a silicon oxide film containing nitrogen is provided thereover as a second layer.

The first layer of the barrier layer 303 is an insulating film and is a dense film with a purpose to prevent impurity diffusion, whereas one of purposes of the second layer is to relax stress so that internal stress of the film of the first layer does not affect the upper layer. By provision of the barrier layer 303 over the supporting substrate 300 as described above, the range of choices of the substrate in bonding the LTSS layer can be expanded.

Over the barrier layer 303, the bonding layer 302 is formed to fix the supporting substrate 300 and the LTSS layer 301.

Methods of fabricating the substrates with an SOI structure shown in FIGS. 9A and 9B, and 10A to 10C are described with reference to FIGS. 11A to 11C, 12A and 12B, 13A to 13C, 14A to 14C, 15A and 15B, and 16A to 16C.

Figure 11A:
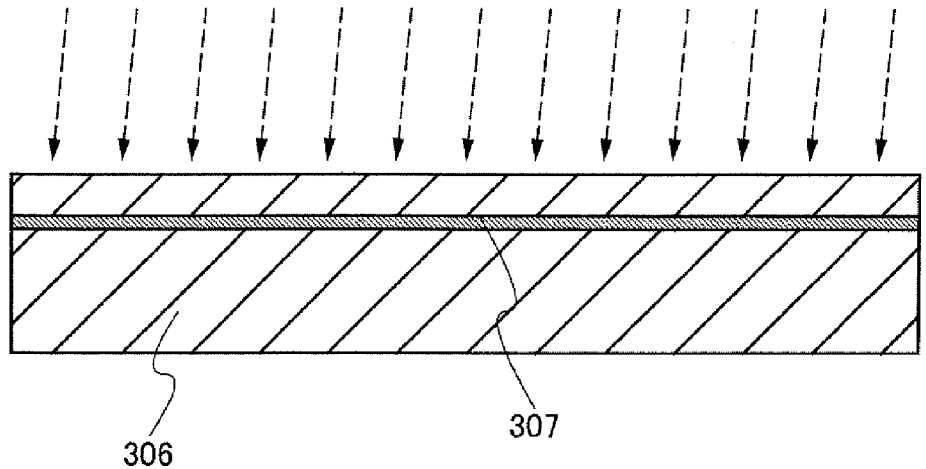
FIGS. 11A to 11C are cross-sectional views illustrating a method of fabricating a substrate with an SOI structure.

Ions that are accelerated by an electric field are implanted to a predetermined depth from a cleaned surface of a semiconductor substrate 306, thereby forming a separation layer 307 (see FIG. 11A). The depth at which the separation layer 307 is formed in the semiconductor substrate 306 is controlled by ion accelerating energy and ion incident angle. The separation layer 307 is formed in a region at a depth close to the average penetration depth of the ions from the surface of the semiconductor substrate 306. For example, the thickness of an LTSS layer is 5 to 500 nm, preferably, 10 to 200 nm, and the accelerating voltage at the time of implanting ions is determined in consideration of such a thickness. Ion implantation is preferably performed using an ion doping apparatus. That is, doping is used, by which a plurality of ion species that is generated from a plasma of a source gas is implanted without any mass separation being performed.

In this embodiment mode, it is preferable that ions of one or a plurality of the same atoms with different masses be implanted. Ion doping may be performed with an accelerating voltage of 10 to 100 keV, preferably, 30 to 80 keV, at a dosage of $1\times10^{16}$ to $4\times10^{16}/cm^2$, and with a beam current density of 2 $\mu A/cm^2$ or more, preferably, 5 $\mu A/cm^2$ or more, more preferably, 10 $\mu A/cm^2$ or more.

In the case of implanting hydrogen ions, the hydrogen ions preferably include $H^+$, $H_2^+$, and $H_3^+$ ions with a high proportion of $H_3^+$ ions. In the case of implanting hydrogen ions, when the hydrogen ions are made to include $H^+$, $H_2^+$, and $H_3^+$ ions with a high proportion of $H_3^+$ ions, implantation efficiency can be increased and implantation time can be shortened. Accordingly, the separation layer 307 formed in the semiconductor substrate 306 can be made to contain hydrogen at $1\times10^{20}/cm^3$ (preferably, $5\times10^{20}/cm^3$) or more.

When a high-concentration hydrogen-implanted region is locally formed in the semiconductor substrate 306, a crystal structure is disordered and microvoids are formed, whereby the separation layer 307 can be made to have a porous structure. In this case, by heat treatment at relatively low temperature, a change occurs in the volume of the microvoids formed in the separation layer 307, which enables cleavage to occur along the separation layer 307 and enables a thin LTSS layer to be formed.

Even if ions are implanted into the semiconductor substrate 306 with mass separation being performed, the separation layer 307 can be similarly formed as described above. In this case, selective implantation of ions with large mass (for example, $H_3^+$ ions) is also preferable because similar effects to those described above can be achieved.

As a gas from which ions are generated, deuterium or an inert gas such as helium, as well as hydrogen, can be selected. By use of helium as a source gas and an ion doping apparatus which does not have a mass separation function, an ion beam with a high proportion of $He^+$ ions can be obtained. By implantation of such ions into the semiconductor substrate 306, microvoids can be formed and the separation layer 307 similar to that described above can be formed in the semiconductor substrate 306.

In formation of the separation layer 307, ions need to be implanted at a high dosage, and there are cases where the surface of the semiconductor substrate 306 be roughened. Therefore, a surface, through which ions are implanted, may be provided with a dense film. For example, a protective film against ion implantation, which is made of a silicon nitride film, a silicon nitride film containing oxygen, or the like, may be provided at a thickness of 50 to 200 nm.

Figure 11B:
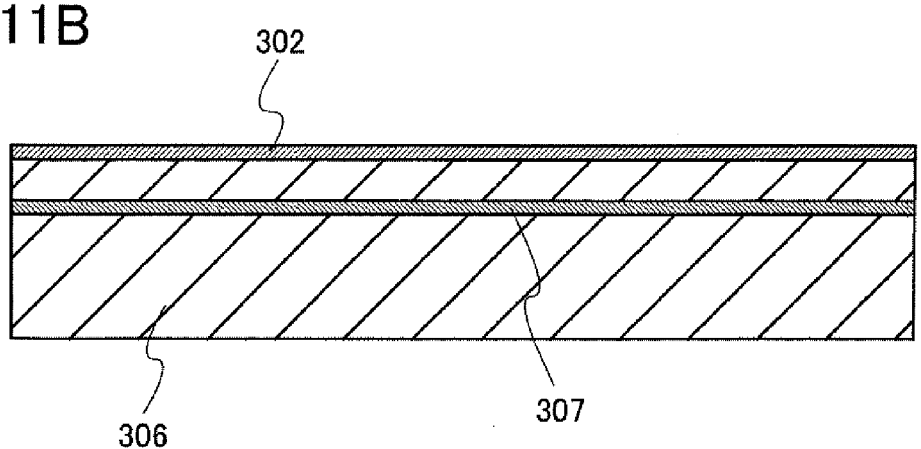

Next, a silicon oxide film is formed as a bonding layer 302 on a surface which is to form a bond with a supporting substrate 300 (see FIG. 11B). The thickness of the silicon oxide film may be 10 to 200 nm, preferably, 10 to 100 nm, more preferably, 20 to 50 nm.

As the silicon oxide film, a silicon oxide film formed by chemical vapor deposition using an organic silane gas as described above is preferable. Alternatively, a silicon oxide film formed by chemical vapor deposition using a silane gas can be used. Film formation by chemical vapor deposition is performed at a temperature, for example, 350° C. or lower, at which degassing of the separation layer 307 that is formed in a single-crystalline semiconductor substrate does not occur. In addition, heat treatment for separation of an LTSS layer from a single-crystalline or polycrystalline semiconductor substrate is performed at a temperature higher than the temperature at which the silicon oxide film is formed.

Figure 11C:
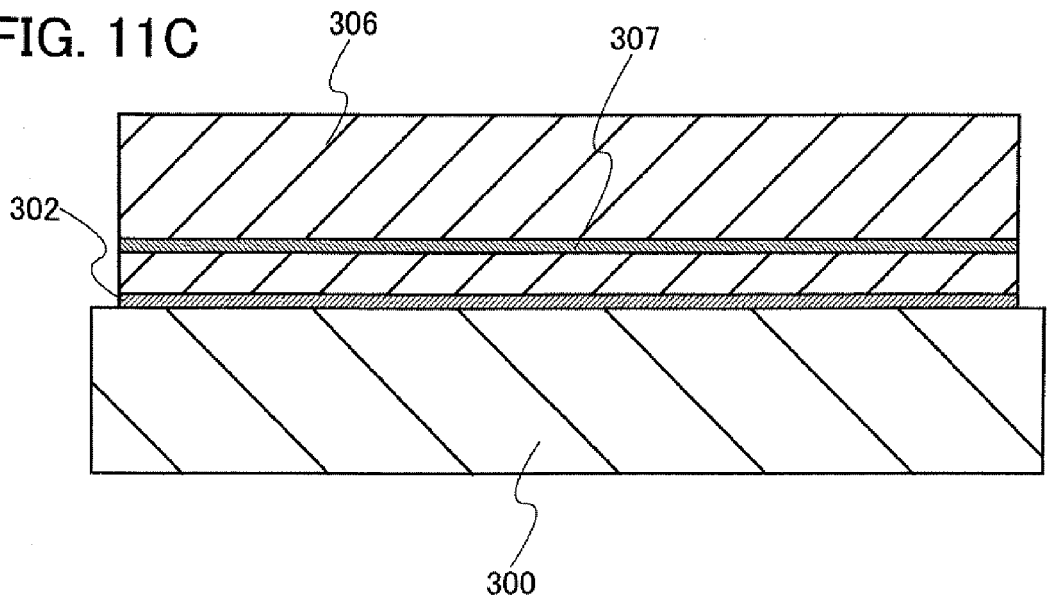

A bond is formed by making the supporting substrate 300 and the surface of the semiconductor substrate 306 where the bonding layer 302 is formed face each other and be in contact with each other (see FIG. 11C). A surface which is to form a bond is cleaned sufficiently. Then, the supporting substrate 300 and the bonding layer 302 are located in contact with each other, whereby a bond is formed. It can be considered that Van der Waals forces act at the initial stage of bonding and that a strong bond due to hydrogen bonding can be formed by pressure bonding of the supporting substrate 300 and the semiconductor substrate 306.

In order to form a favorable bond, a surface may be activated. For example, the surface which is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such surface treatment makes it possible to increase bonding strength between different kinds of materials even at a temperature of 200 to 400° C.

First heat treatment is performed in a state where the semiconductor substrate 306 and the supporting substrate 300 are superposed on each other. By the first heat treatment, separation of the semiconductor substrate 306 is performed while a thin semiconductor layer (LTSS layer) is left remaining over the supporting substrate 300 (see FIG. 12A). The first heat treatment is preferably performed at a temperature equal to or higher than the temperature at which the bonding layer 302 is formed, preferably at equal to or higher than 400° C. to lower than 600° C. Through the heat treatment performed within this temperature range, a change occurs in the volume of the microvoids formed in the separation layer 307, which allows a semiconductor layer to be cleaved along the separation layer 307. Because the bonding layer 302 is bonded to the supporting substrate 300, an LTSS layer 301 having the same crystallinity as that of the semiconductor substrate 306 is fixed to the supporting substrate 300 in this mode.

Figure 12A:
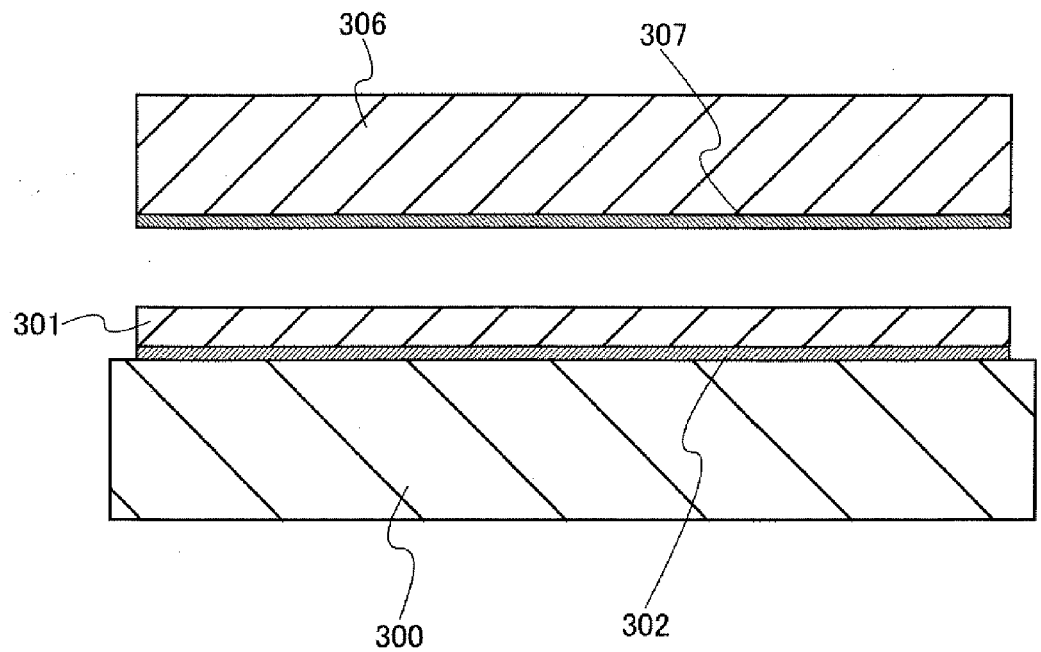
FIGS. 12A and 12B are cross-sectional views illustrating a method of fabricating a substrate with an SOI structure.
Figure 12B:
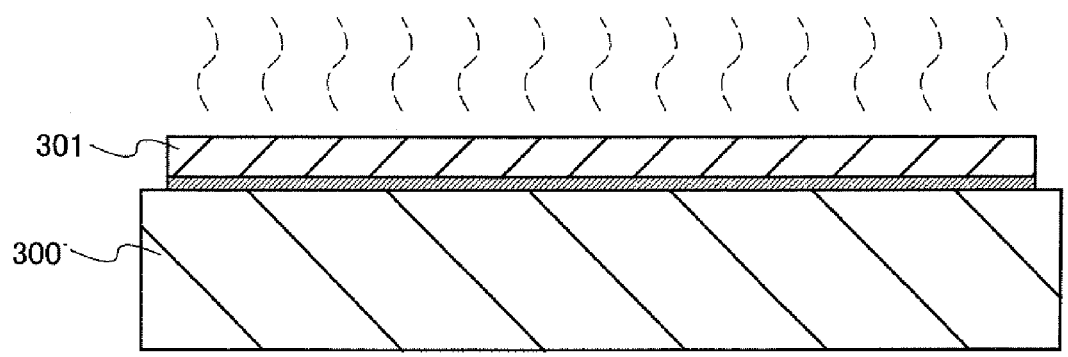

Next, second heat treatment is performed in a state where the LTSS layer 301 is bonded to the supporting substrate 300 (see FIG. 12B). It is preferable that the second heat treatment be performed at a temperature higher than the temperature of the first heat treatment and lower than the strain point of the supporting substrate 300. Alternatively, even if the first heat treatment and the second heat treatment are performed at the same temperature, it is preferable that the second heat treatment be performed for a longer period of treatment time. The heat treatment may be performed so that the supporting substrate 300 and/or the LTSS layer 301 are/is heated by thermal conduction heating, convection heating, radiation heating, or the like. As a heat treatment apparatus, an electrically heated oven, a lamp annealing furnace, or the like can be used. The second heat treatment may be performed with multilevel changes of temperature. Alternatively, a rapid thermal annealing (RTA) apparatus may be used. If the heat treatment is performed using an RTA apparatus, heating up to near a substrate strain point or a temperature slightly higher than the substrate strain point is also possible.

Through the second heat treatment, residual stress of the LTSS layer 301 can be relaxed. That is, the second heat treatment can relax thermal distortion caused by a difference in coefficient of expansion between the supporting substrate 300 and the LTSS layer 301. In addition, the second heat treatment is effective in recovering the crystallinity of the LTSS layer 301, which is impaired by ion implantation. Furthermore, the second heat treatment is also effective in recovering damage of the LTSS layer 301, which is caused when the semiconductor substrate 306 is bonded to the supporting substrate 300 and then divided by the first heat treatment. Moreover, by the first heat treatment and the second heat treatment, hydrogen bonds can be changed into stronger covalent bonds.

For the purpose of planarization of the surface of the LTSS layer 301, a chemical mechanical polishing (CMP) process may be performed. The CMP process can be performed after the first heat treatment or the second heat treatment. Note that, when the CMP process is performed before the second heat treatment, it is possible to planarize the surface of the LTSS layer 301 by the CMP process and recover a damaged layer on the surface which is formed due to the CMP process by the second heat treatment.

In any event, by the first heat treatment and the second heat treatment performed in combination as described in this mode, a crystalline semiconductor layer with excellent crystallinity can be provided over a supporting substrate which is weak against heat, such as a glass substrate.

Through the steps of FIGS. 11A to 11C and FIGS. 12A and 12B, the SOI substrate shown in FIG. 9A is formed.

A method of forming the substrate with an SOI structure shown in FIG. 9B is described with reference to FIGS. 15A and 15B.

Based on the manufacturing steps shown in FIGS. 11A and 11B, a separation layer 307 is formed in a semiconductor substrate 306, and a bonding layer 302 is formed on a surface of the semiconductor substrate 306 which is to form a bond with a supporting substrate 300.

Figure 15A:
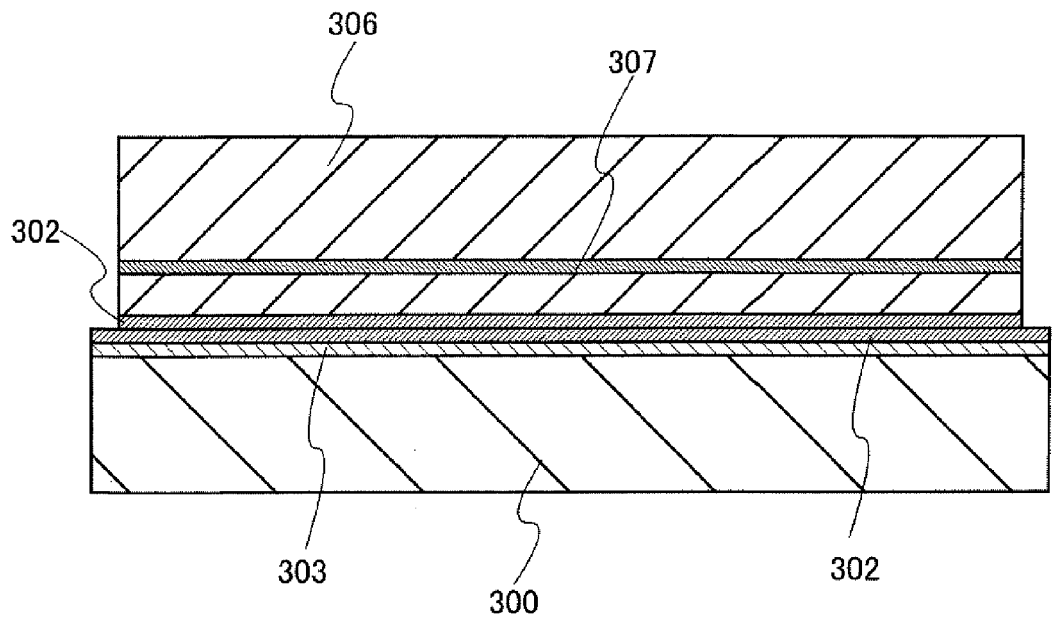
FIGS. 15A and 15B are cross-sectional views illustrating a method of fabricating a substrate with an SOI structure.
Figure 15B:
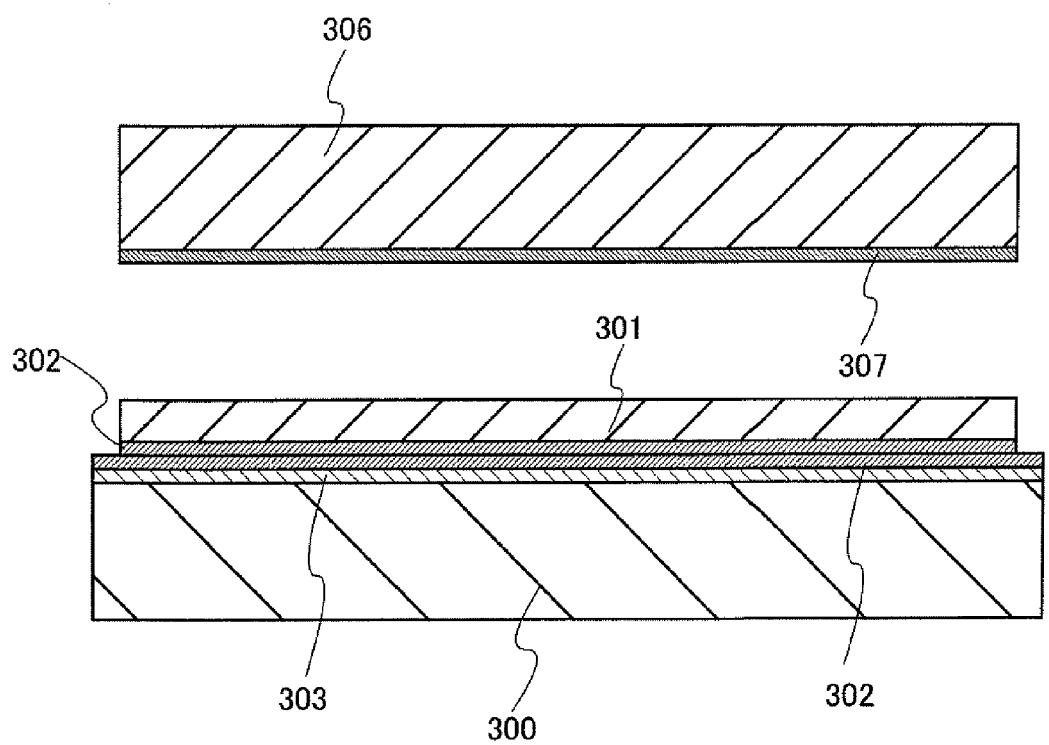

Next, the supporting substrate 300 provided with a barrier layer 303 and a bonding layer 302 and the bonding layer 302 of the semiconductor substrate 306 are located in contact with each other, thereby forming a bond (see FIG. 15A).

In this state, first heat treatment is performed. The first heat treatment is preferably performed at a temperature equal to or higher than the temperature at which the bonding layer 302 is formed, preferably at equal to or higher than 400° C. to lower than 600° C. Accordingly, a change occurs in the volume of the microvoids formed in the separation layer 307, which can cause cleavage in the semiconductor substrate 306. Over the supporting substrate 300, an LTSS layer 301 having the same crystallinity as that of the semiconductor substrate 306 is formed (see FIG. 15B).

Next, second heat treatment is performed in a state where the LTSS layer 301 is bonded to the supporting substrate 300. It is preferable that the second heat treatment be performed at a temperature higher than the temperature of the first heat treatment and lower than the strain point of the supporting substrate 300. Alternatively, even if the first heat treatment and the second heat treatment are performed at the same temperature, it is preferable that the second heat treatment be performed for a longer period of treatment time. The heat treatment may be performed so that the supporting substrate 300 and/or the LTSS layer 301 are/is heated by thermal conduction heating, convection heating, radiation heating, or the like. Through the second heat treatment, residual stress of the LTSS layer 301 can be relaxed, and the second heat treatment is also effective in recovering the damage of the LTSS layer 301 caused by division through the first heat treatment.

In the above-described manner, the SOI substrate shown in FIG. 9B is formed.

Next, a method of fabricating the substrate with an SOI structure shown in FIG. 10A is described with reference to FIGS. 16A to 16C.

First, based on the manufacturing step shown in FIG. 11A, a separation layer 307 is formed in a semiconductor substrate 306.

Next, an insulating layer 304 is formed on the surface of the semiconductor substrate 306. It is preferable that the insulating layer 304 be a nitrogen-containing insulating layer For example, the insulating layer 304 can be formed using a single film or a plurality of stacked films selected from a silicon nitride film, a silicon nitride film containing oxygen, and a silicon oxide film containing nitrogen.

Figure 16A:
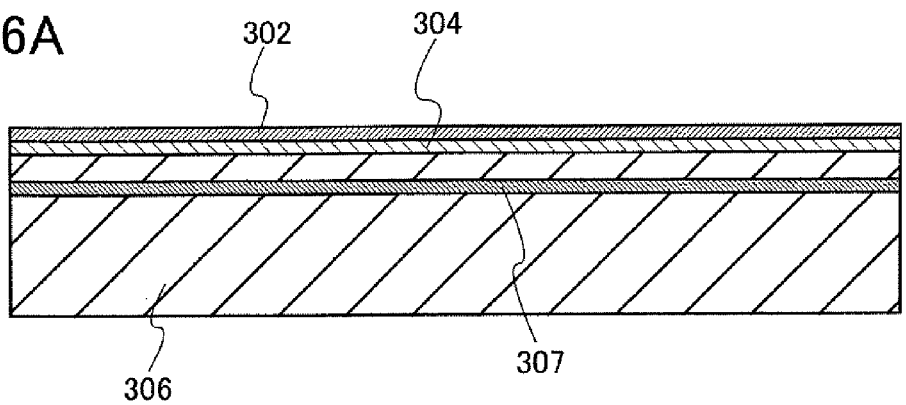
FIGS. 16A to 16C are cross-sectional views illustrating a method of fabricating a substrate with an SOI structure.

Furthermore, a silicon oxide film is formed as a bonding layer 302 over the insulating layer 304 (see FIG. 16A).

Figure 16B:
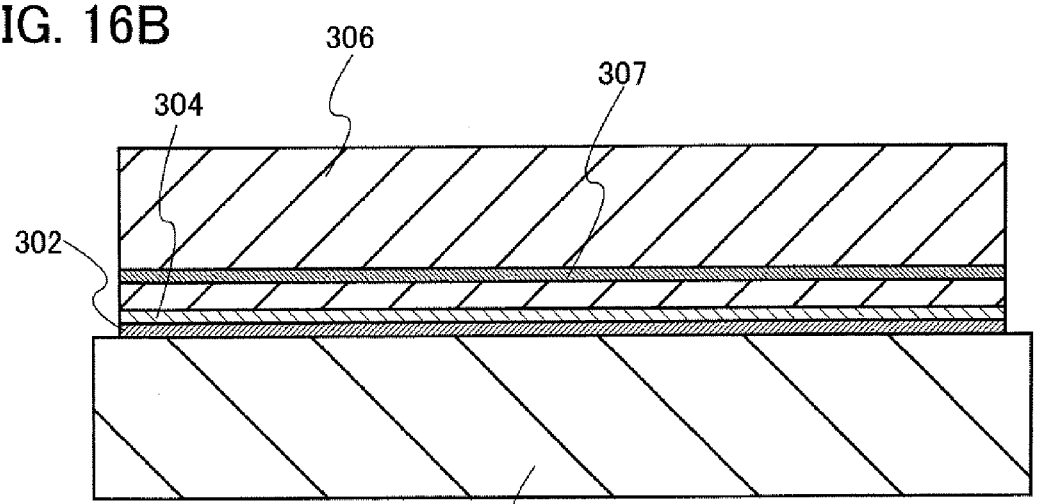

A bond is formed by making a supporting substrate 300 and the surface of the semiconductor substrate 306 where the bonding layer 302 is formed face each other and be in contact with each other (see FIG. 16B).

In this state, first heat treatment is performed. The first heat treatment is preferably performed at a temperature equal to or higher than the temperature at which the bonding layer 302 is formed, preferably at equal to or higher than 400° C. to lower than 600° C. Accordingly, a change occurs in the volume of the microvoids formed in the separation layer 307, which can cause cleavage in the semiconductor substrate 306. Over the supporting substrate 300, an LTSS layer 301 having the same crystallinity as that of the semiconductor substrate 306 is formed (see FIG. 16C).

Next, second heat treatment is performed in a state where the LTSS layer 301 is bonded to the supporting substrate 300. It is preferable that the second heat treatment be performed at a temperature higher than the temperature of the first heat treatment and lower than the strain point of the supporting substrate 300. Alternatively, even if the first heat treatment and the second heat treatment are performed at the same temperature, it is preferable that the second heat treatment be performed for a longer period of treatment time. The heat treatment may be performed so that the supporting substrate 300 and/or the LTSS layer 301 are/is heated by thermal conduction heating, convection heating, radiation heating, or the like. Through the second heat treatment, residual stress of the LTSS layer 301 can be relaxed, and the second heat treatment is also effective in recovering the damage of the LTSS layer 301 caused by division through the first heat treatment.

Figure 16C:
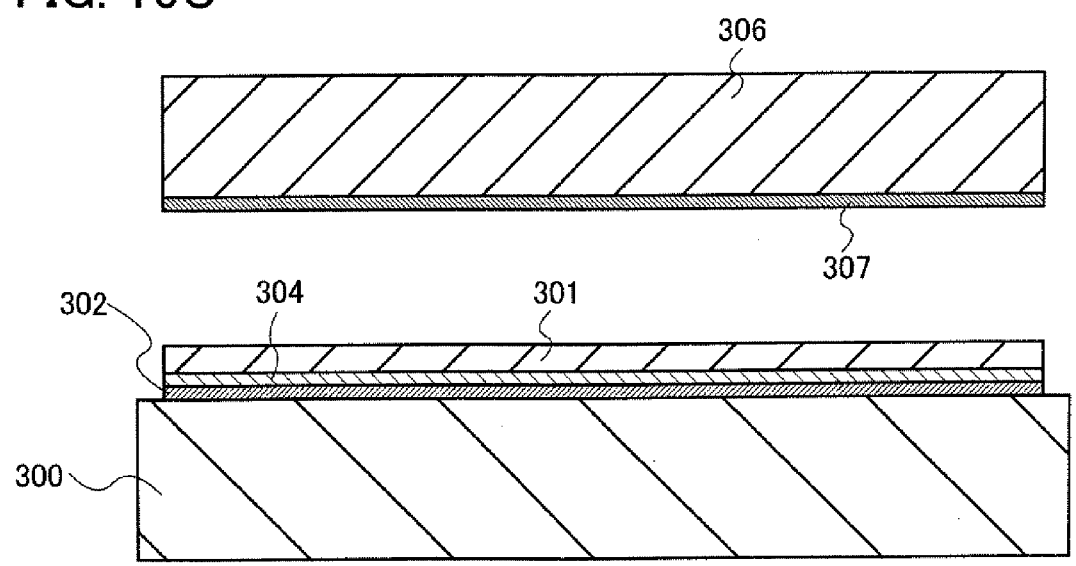

When the insulating layer 304 is formed over the semiconductor substrate 306 as shown in FIGS. 16A to 16C, the insulating layer 304 prevents an impurity from being mixed into the LTSS layer 301; accordingly, the LTSS layer 301 can be prevented from being contaminated.

Figure 13A:
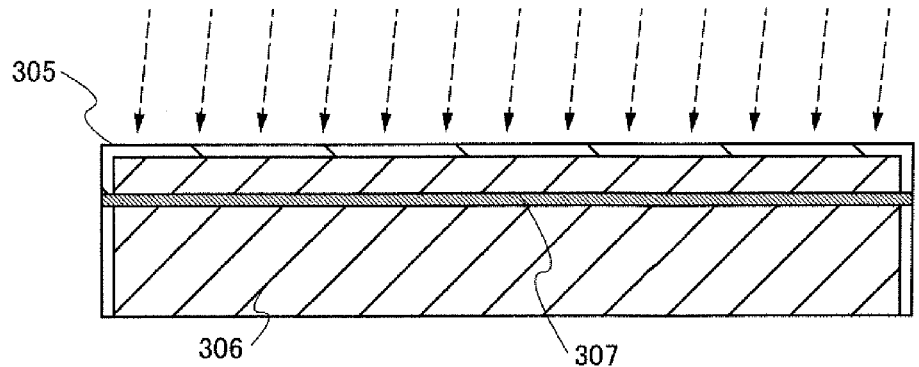
FIGS. 13A to 13C are cross-sectional views illustrating a method of fabricating a substrate with an SOI structure.
Figure 13B:
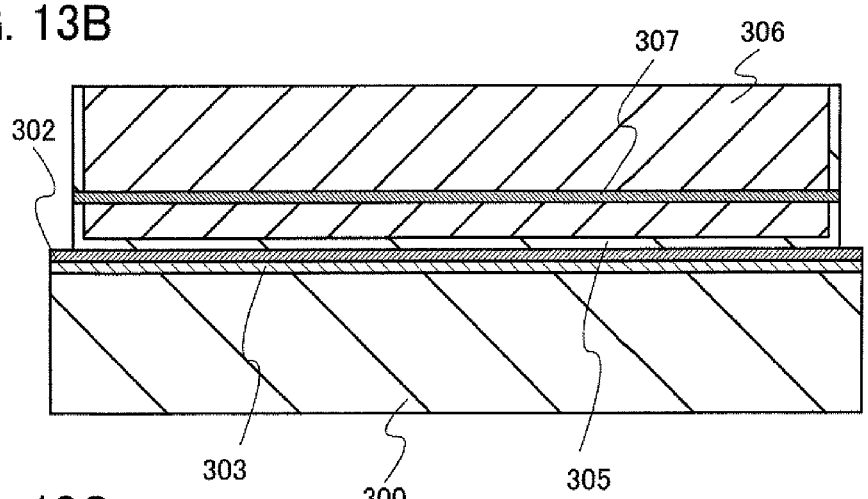
Figure 13C:
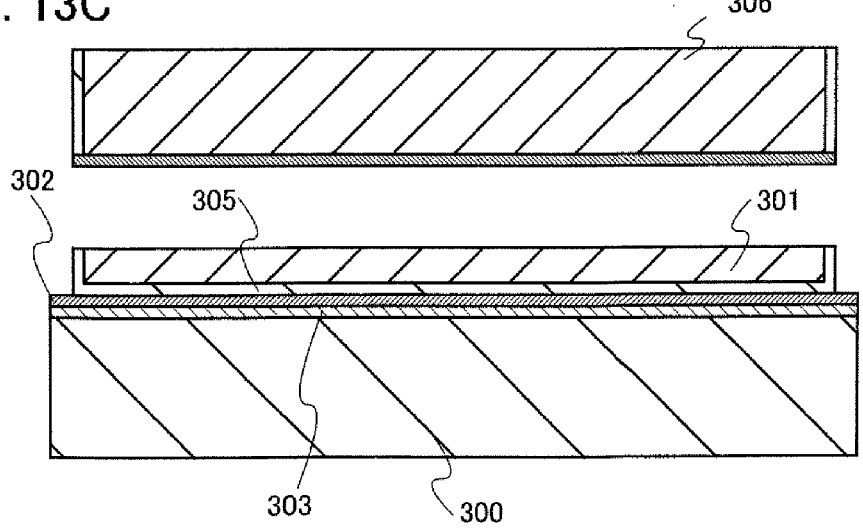

FIGS. 13A to 13C show steps of providing a bonding layer on a supporting substrate side and fabricating a substrate with an SOI structure having an LTSS layer.

First, ions that are accelerated by an electric field are implanted into a semiconductor substrate 306, which is provided with a silicon oxide layer 305, to a predetermined depth, thereby forming a separation layer 307 (see FIG. 13A). The silicon oxide layer 305 may be formed over the semiconductor substrate 306 by sputtering or CVD, or when the semiconductor substrate 306 is a single-crystalline silicon substrate, the silicon oxide layer 305 may be formed by thermal oxidation of the semiconductor substrate 306. In this embodiment mode, the semiconductor substrate 306 is a single-crystalline silicon substrate, and the silicon oxide layer 305 is formed by thermal oxidation of the single-crystalline silicon substrate.

The implantation of ions into the semiconductor substrate 306 is performed in a similar manner to the case of FIG. 11A. By formation of the silicon oxide layer 305 on the surface of the semiconductor substrate 306, the surface can be prevented from being damaged by ion implantation and losing its planarity.

A supporting substrate 300 provided with a barrier layer 303 and a bonding layer 302 and the surface of the semiconductor substrate 306 where the silicon oxide layer 305 is formed are located in contact with each other, thereby forming a bond (see FIG. 13B).

In this state, first heat treatment is performed. The first heat treatment is preferably performed at a temperature equal to or higher than the temperature at which the bonding layer 302 is formed, preferably at equal to or higher than 400° C. to lower than 600° C. Accordingly, a change occurs in the volume of the microvoids formed in the separation layer 307, which can cause cleavage in the semiconductor substrate 306. Over the supporting substrate 300, an LTSS layer 301 having the same crystallinity as that of the semiconductor substrate 306 is formed (see FIG. 13C).

Next, second heat treatment is performed in a state where the LTSS layer 301 is bonded to the supporting substrate 300. It is preferable that the second heat treatment be performed at a temperature higher than the temperature of the first heat treatment and lower than the strain point of the supporting substrate 300. Alternatively, even if the first heat treatment and the second heat treatment are performed at the same temperature, it is preferable that the second heat treatment be performed for a longer period of treatment time. The heat treatment may be performed so that the supporting substrate 300 and/or the LTSS layer 301 are/is heated by thermal conduction heating, convection heating, radiation heating, or the like. Through the second heat treatment, residual stress of the LTSS layer 301 can be relaxed, and the second heat treatment is also effective in recovering the damage of the LTSS layer 301 caused by division through the first heat treatment.

In the above-described manner, the SOI substrate shown in FIG. 10B is formed.

Figure 14A:
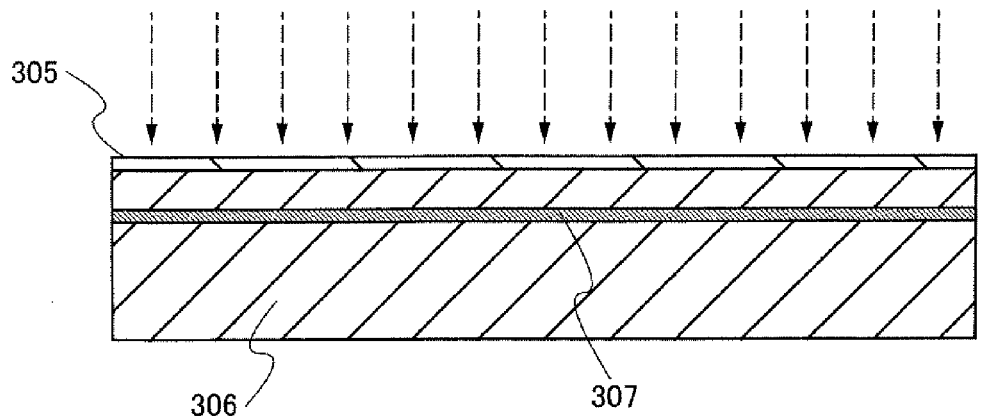
FIGS. 14A to 14C are cross-sectional views illustrating a method of fabricating a substrate with an SOI structure.
Figure 14B:
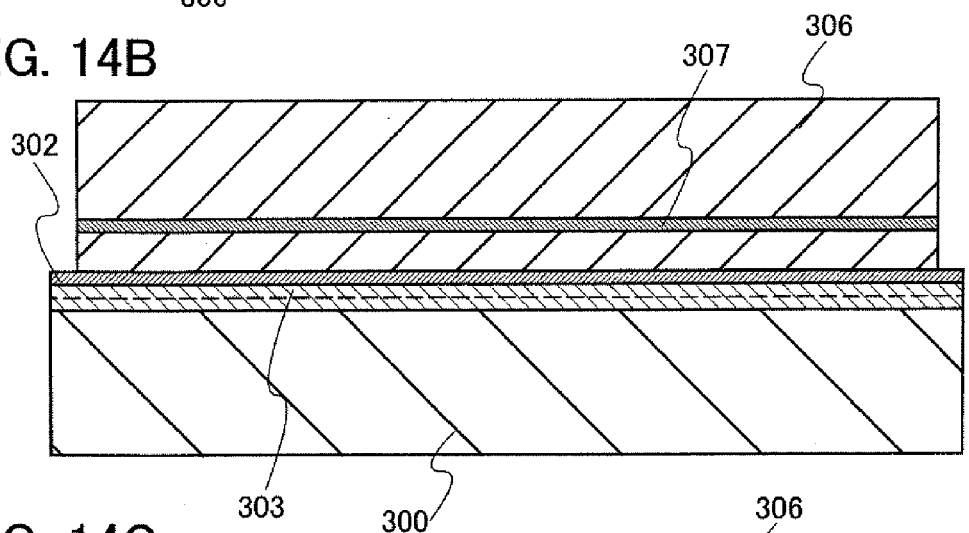
Figure 14C:
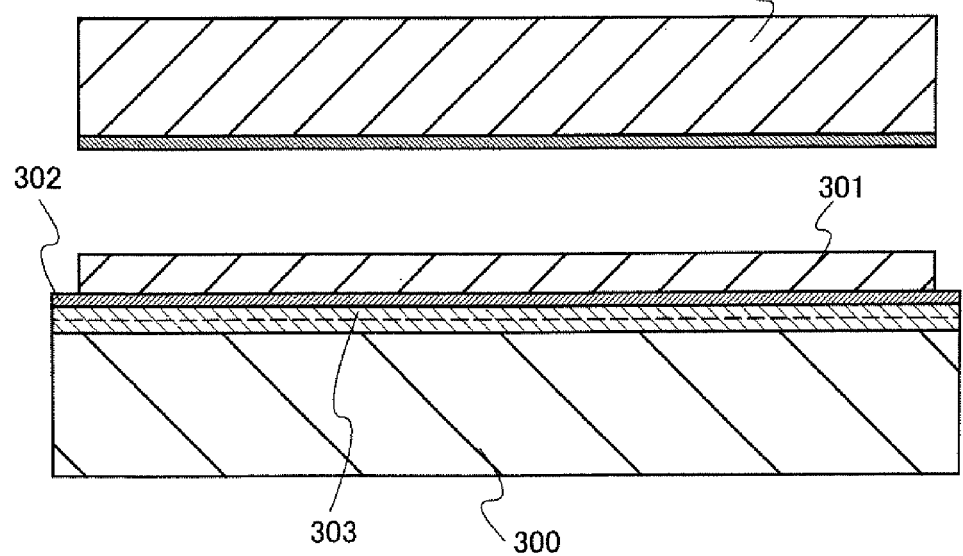

FIGS. 14A to 14C show another example in the case where a bonding layer is provided on a supporting substrate side to bond an LTSS layer.

First, a separation layer 307 is formed in a semiconductor substrate 306 (see FIG. 14A). The implantation of ions for formation of the separation layer 307 is performed using an ion doping apparatus. In this step, the semiconductor substrate 306 is irradiated with ions with different masses which are accelerated by a high electric field.

At this time, it is preferable that a silicon oxide layer 305 be provided as a protective film because the planarity of the surface of the semiconductor substrate 306 may be impaired by ion irradiation. The silicon oxide layer 305 may be formed by thermal oxidation or by using a chemical oxide. A chemical oxide can be formed by immersion of the semiconductor substrate 306 in an oxidizing chemical solution. For example, by treatment of the semiconductor substrate 306 with an ozone-containing aqueous solution, a chemical oxide is formed on the surface.

Alternatively, as the protective film, a silicon oxide film containing nitrogen or a silicon nitride film containing oxygen formed by plasma CVD, or a silicon oxide film formed using TEOS may be used.

It is preferable that a supporting substrate 300 be provided with a barrier layer 303. By provision of the barrier layer 303, an LTSS layer 301 can be prevented from being contaminated by a mobile ion impurity like alkali metal or alkaline earth metal that is diffused from a glass substrate that is used as the supporting substrate 300.

The barrier layer 303 is formed of a single layer or a plurality of layers. For example, a silicon nitride film or a silicon nitride film containing oxygen which is highly effective in blocking ions of sodium or the like is used as a first layer, and a silicon oxide film or a silicon oxide film containing nitrogen is provided thereover as a second layer.

The first layer of the barrier layer 303 is an insulating film and is a dense film with a purpose to prevent impurity diffusion, whereas one of purposes of the second layer is to relax stress so that internal stress of the film of the first layer does not affect the upper layer. By provision of the barrier layer 303 over the supporting substrate 300 as described above, the range of choices of the substrate in bonding the LTSS layer can be expanded.

The supporting substrate 300 provided with a bonding layer 302 over the barrier layer 303 and the semiconductor substrate 306 are bonded together (see FIG. 14B). The surface of the semiconductor substrate 306 is exposed by removal of the silicon oxide layer 305, which has been provided as a protective film, with a hydrofluoric acid. The outermost surface of the semiconductor substrate 306 may be in a state where the surface is terminated with hydrogen by treatment with a hydrofluoric acid solution. In formation of the bond, hydrogen bonds are formed by surface-terminating hydrogen, and a favorable bond can be formed.

Furthermore, irradiation with ions of an inert gas may be performed so that dangling bonds are exposed on the outermost surface of the semiconductor substrate 306, and a bond may be formed in vacuum.

In this state, first heat treatment is performed. The first heat treatment is preferably performed at a temperature equal to or higher than the temperature at which the bonding layer 302 is formed, preferably, at equal to or higher than 400° C. to lower than 600° C. Accordingly, a change occurs in the volume of the microvoids formed in the separation layer 307, which can cause cleavage in the semiconductor substrate 306. Over the supporting substrate 300, an LTSS layer 301 having the same crystallinity as that of the semiconductor substrate 306 is formed (see FIG. 14C).

Next, second heat treatment is performed in a state where the LTSS layer 301 is bonded to the supporting substrate 300. It is preferable that the second heat treatment be performed at a temperature higher than the temperature of the first heat treatment and Lower than the strain point of the supporting substrate 300. Alternatively, even if the first heat treatment and the second heat treatment are performed at the same temperature, it is preferable that the second heat treatment be performed for a longer period of treatment time.

The heat treatment may be performed so that the supporting substrate 300 and/or the LTSS layer 301 are/is heated by thermal conduction heating, convection heating, radiation heating, or the like. Through the second heat treatment, residual stress of the LTSS layer 301 can be relaxed, and the second heat treatment is also effective in recovering the damage of the LTSS layer 301 caused by division through the first heat treatment, In the above-described manner, the SOI substrate shown in FIG. 10C is formed.

According to this embodiment mode, even if the supporting substrate 300 having an allowable temperature limit of 700° C. or lower such as a glass substrate is used, the LTSS layer 301 which has a strong bonding force in a bonding portion can be obtained. As the supporting substrate 300, it is possible to use any of a variety of glass substrates that are used in the electronics industry and that are referred to as non-alkali glass substrates, such as aluminosilicate glass substrates, aluminoborosilicate glass substrates, and barium borosilicate glass substrates.

The island-like semiconductor film 102 described in Embodiment Mode 1 can be obtained by patterning the LTSS layer 301 into an island shape. The LTSS layer 301 obtained in this embodiment mode is a single-crystalline semiconductor layer; thus, a semiconductor device with high response speed can be fabricated.

The present application is based on Japanese Priority Application No. 2007-166495 filed on Jun. 25, 2007 with the Japanese Patent Office, the entire contents of which are hereby incorporated by reference.

The invention claimed is:

1. A semiconductor device comprising:
an island-like semiconductor film formed over an insulating surface, the island-like semiconductor film including a channel formation region and a high-concentration impurity region;
a first insulating film formed over the island-like semiconductor film;
a second insulating film formed over the first insulating film, the second insulating film comprising a first metal;
a floating gate comprising a film, the film comprising a second metal;
a gate insulating film formed over the floating gate; and
a control gate formed over the gate insulating film,
wherein the film is in contact with the second insulating film,
wherein the first metal and the second metal are the same metal, and
wherein a part of the control gate is located outside an edge of the floating gate with the gate insulating film interposed therebetween.

2. The semiconductor device according to claim 1, further comprising a third insulating film between the floating gate and the gate insulating film, wherein the third insulating film comprises an oxide film of the second metal.

3. The semiconductor device according to claim 1, wherein the second metal is titanium.

4. The semiconductor device according to claim 1, wherein the second metal is one selected from the group consisting of titanium, tantalum, and tungsten.

5. The semiconductor device according to claim 1, wherein the island-like semiconductor film is formed of a single-crystalline semiconductor layer.

6. The semiconductor device according to claim 1, wherein the gate insulating film covers top and side surfaces of the floating gate.

7. The semiconductor device according to claim 1, wherein the gate insulating film covers a side surface of the first insulating film and a side surface of the second insulating film.

8. The semiconductor device according to claim 1, further comprising a low-concentration impurity region in the island-like semiconductor film,
wherein the control gate overlaps with the channel formation region and the low-concentration impurity region.

9. The semiconductor device according to claim 1, wherein a thickness of the second insulating film is 5 nm.

10. The semiconductor device according to claim 1, where a thickness of the film comprising the second metal is 20 nm.

11. A semiconductor device comprising:
an antenna;
a modulation circuit operationally connected to the antenna;
a demodulation circuit operationally connected to the antenna;
an arithmetic processing circuit operationally connected to the modulation circuit and the demodulation circuit;
a power supply circuit operationally connected to the demodulation circuit; and
a memory circuit operationally connected to the power supply circuit, the memory circuit comprising:
an island-like semiconductor film formed over an insulating surface, the island-like semiconductor film including a channel formation region and a high-concentration impurity region;
a first insulating film formed over the island-like semiconductor film;

a second insulating film formed over the first insulating film, the second insulating film comprising a first metal;

a floating gate comprising a film, the film comprising a second metal;

a gate insulating film formed over the floating gate; and a control gate formed over the gate insulating film, wherein the film is in contact with the second insulating film, wherein the first metal and the second metal are the same metal, and wherein a part of the control gate is located outside an edge of the floating gate with the gate insulating film interposed therebetween.

12. The semiconductor device according to claim 11, further comprising a third insulating film between the floating gate and the gate insulating film, wherein the third insulating film comprises an oxide film of the second metal.

13. The semiconductor device according to claim 11, wherein the second metal is titanium.

14. The semiconductor device according to claim 11, wherein the second metal is one selected from the group consisting of titanium, tantalum, and tungsten.

15. The semiconductor device according to claim 11, wherein the island-like semiconductor film is formed of a single-crystalline semiconductor layer.

16. The semiconductor device according to claim 11, wherein the gate insulating film covers top and side surfaces of the floating gate.

17. The semiconductor device according to claim 11, wherein the gate insulating film covers a side surface of the first insulating film and a side surface of the second insulating film.

18. The semiconductor device according to claim 11, further comprising a low-concentration impurity region in the island-like semiconductor film, wherein the control gate overlaps with the channel formation region and the low-concentration impurity region.

19. The semiconductor device according to claim 11, wherein a thickness of the second insulating film is 5 nm.

20. The semiconductor device according to claim 11, wherein a thickness of the film comprising the second metal is 20 nm.

21. A semiconductor device comprising:

a semiconductor, the semiconductor including a channel formation region and a high-concentration impurity region;

a first insulating film formed over the semiconductor;

a second insulating film formed over the first insulating film, the second insulating film comprising a first metal;

a floating gate comprising a film, the film comprising a second metal;

a gate insulating film formed over the floating gate; and a control gate formed over the gate insulating film, wherein the film is in contact with the second insulating film, wherein the first metal and the second metal are the same metal, and wherein a part of the control gate is located outside an edge of the floating gate with the gate insulating film interposed therebetween.

22. The semiconductor device according to claim 21, further comprising a third insulating film between the floating gate and the gate insulating film, wherein the third insulating film comprises an oxide film of the second metal.

23. The semiconductor device according to claim 21, wherein the second metal is titanium.

24. The semiconductor device according to claim 21, wherein the second metal is one selected from the group consisting of titanium, tantalum, and tungsten.

25. The semiconductor device according to claim 21, wherein the gate insulating film covers top and side surfaces of the floating gate.

26. The semiconductor device according to claim 21, wherein the gate insulating film covers a side surface of the first insulating film and a side surface of the second insulating film.

27. The semiconductor device according to claim 21, further comprising a low-concentration impurity region in the semiconductor, wherein the control gate overlaps with the channel formation region and the low-concentration impurity region.

28. The semiconductor device according to claim 21, wherein a thickness of the second insulating film is 5 nm.

29. The semiconductor device according to claim 21, wherein a thickness of the film comprising the second metal is 20 nm.

* * * * *